United States Patent
Drowley et al.

(10) Patent No.: US 11,916,134 B2
(45) Date of Patent: Feb. 27, 2024

(54) REGROWTH UNIFORMITY IN GAN VERTICAL DEVICES

(71) Applicant: NEXGEN POWER SYSTEMS, INC., Santa Clara, CA (US)

(72) Inventors: Clifford Drowley, Santa Clara, CA (US); Ray Milano, Santa Clara, CA (US); Subhash Srinivas Pidaparthi, Santa Clara, CA (US); Andrew P. Edwards, Santa Clara, CA (US)

(73) Assignee: NEXGEN POWER SYSTEMS, INC., Santa Clara, CA (US)

( * ) Notice: Subject to any disclaimer, the term of this patent is extended or adjusted under 35 U.S.C. 154(b) by 341 days.

(21) Appl. No.: 17/135,436

(22) Filed: Dec. 28, 2020

(65) Prior Publication Data
US 2021/0210624 A1    Jul. 8, 2021

Related U.S. Application Data

(60) Provisional application No. 62/956,467, filed on Jan. 2, 2020.

(51) Int. Cl.
| | |
|---|---|
| *H01L 29/66* | (2006.01) |
| *H01L 29/20* | (2006.01) |
| *H01L 29/808* | (2006.01) |
| *H01L 21/02* | (2006.01) |
| *H01L 21/306* | (2006.01) |
| *H01L 21/308* | (2006.01) |

(52) U.S. Cl.
CPC .... *H01L 29/66924* (2013.01); *H01L 21/0254* (2013.01); *H01L 21/02639* (2013.01); *H01L 21/308* (2013.01); *H01L 21/30612* (2013.01); *H01L 29/2003* (2013.01); *H01L 29/66909* (2013.01); *H01L 29/8083* (2013.01)

(58) Field of Classification Search
CPC ........... H01L 29/66924; H01L 21/0254; H01L 21/02639; H01L 21/30612; H01L 21/308; H01L 29/2003; H01L 29/66909; H01L 29/8083; H01L 29/0696; H01L 27/0886; H01L 21/823412; H01L 21/823431; H01L 21/823437; H01L 29/0657; H01L 29/0692
USPC .......................................................... 257/76
See application file for complete search history.

(56) References Cited

U.S. PATENT DOCUMENTS

| | | | |
|---|---|---|---|
| 2011/0156050 A1* | 6/2011 | Okada | H01L 29/66462 438/585 |
| 2013/0161705 A1* | 6/2013 | Disney | H01L 29/8083 257/E29.313 |
| 2013/0292686 A1* | 11/2013 | Kizilyalli | H01L 29/66446 438/192 |

(Continued)

*Primary Examiner* — Fazli Erdem
(74) *Attorney, Agent, or Firm* — Kilpatrick Townsend & Stockton LLP

(57) ABSTRACT

A semiconductor device includes a semiconductor substrate having a first conductivity type, a drift layer of the first conductivity type coupled to the semiconductor substrate, a fin array having a first row of fins and a second row of fins on the drift layer, and a space between the first row of fins and the second row of fins. The first row of fins includes a plurality of first elongated fins arranged in parallel to each other along a first row direction and separated by a first distance, and the second row of fins includes a plurality of second elongated fins arranged in parallel to each other along a second row direction and separated by a second distance.

20 Claims, 19 Drawing Sheets

(56) References Cited

U.S. PATENT DOCUMENTS

| | | | |
|---|---|---|---|
| 2013/0299873 A1* | 11/2013 | Disney | H01L 29/66909 |
| | | | 257/E21.403 |
| 2014/0291691 A1* | 10/2014 | Disney | H01L 29/66446 |
| | | | 438/193 |
| 2015/0325576 A1* | 11/2015 | Basker | H01L 29/06 |
| | | | 257/392 |
| 2018/0350917 A1* | 12/2018 | Ujita | H01L 29/42356 |
| 2019/0067120 A1* | 2/2019 | Ching | H01L 27/0924 |
| 2019/0259670 A1* | 8/2019 | Zhuang | H01L 29/66545 |
| 2019/0348527 A1* | 11/2019 | Liaw | H01L 21/823431 |
| 2021/0020580 A1* | 1/2021 | Drowley | H01L 21/823431 |

* cited by examiner

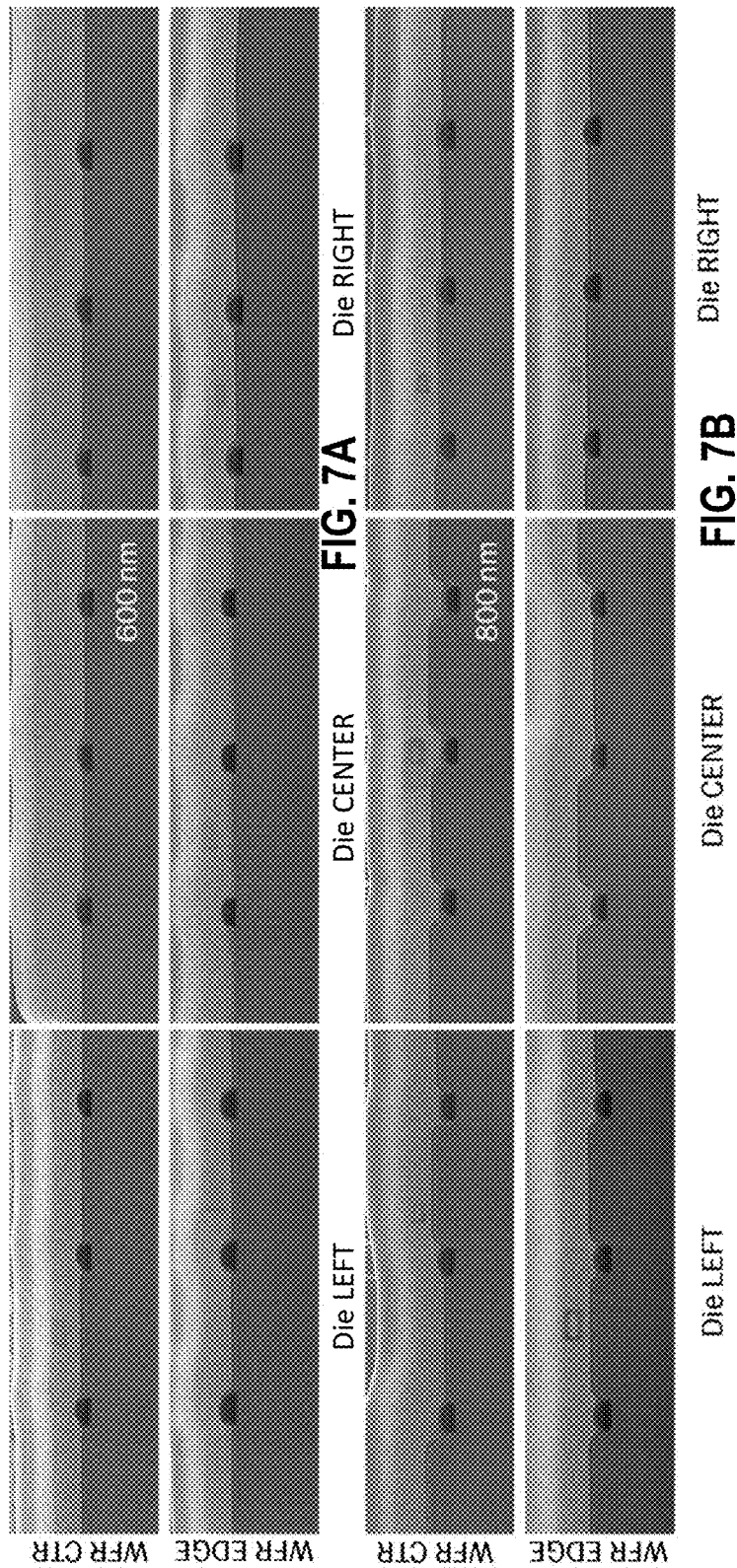

25 μm Fin

50 μm Fin

100 μm Fin

1000 μm Fin

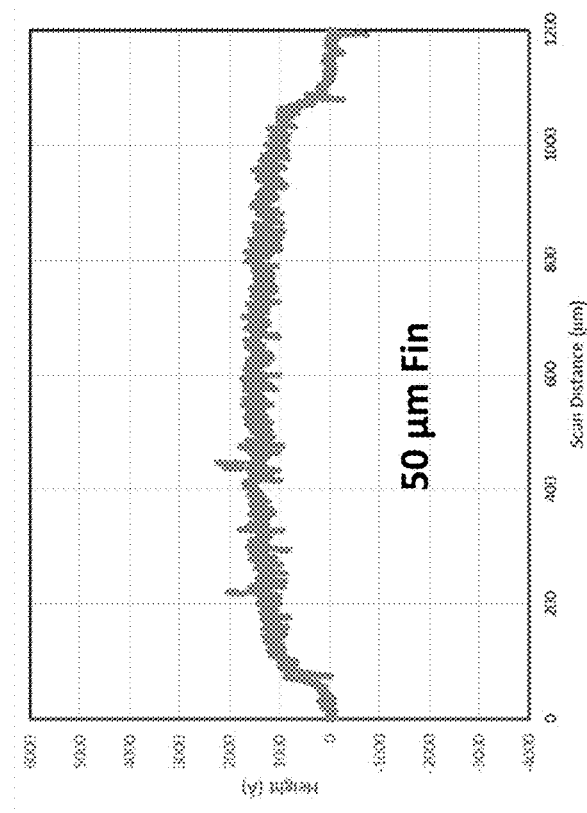
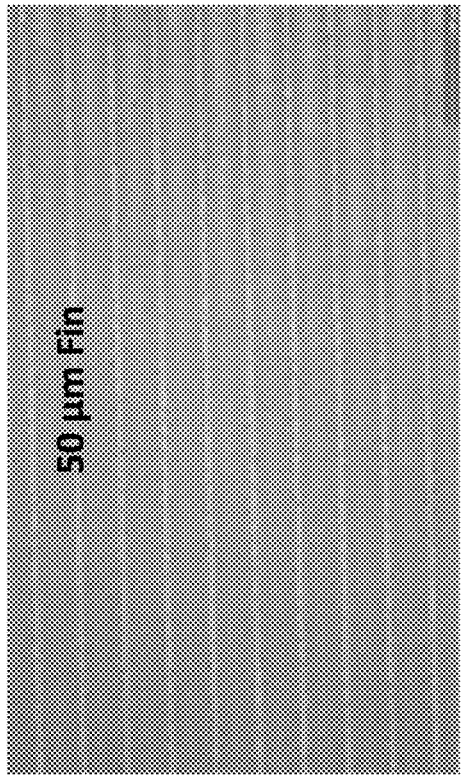
FIG. 11B
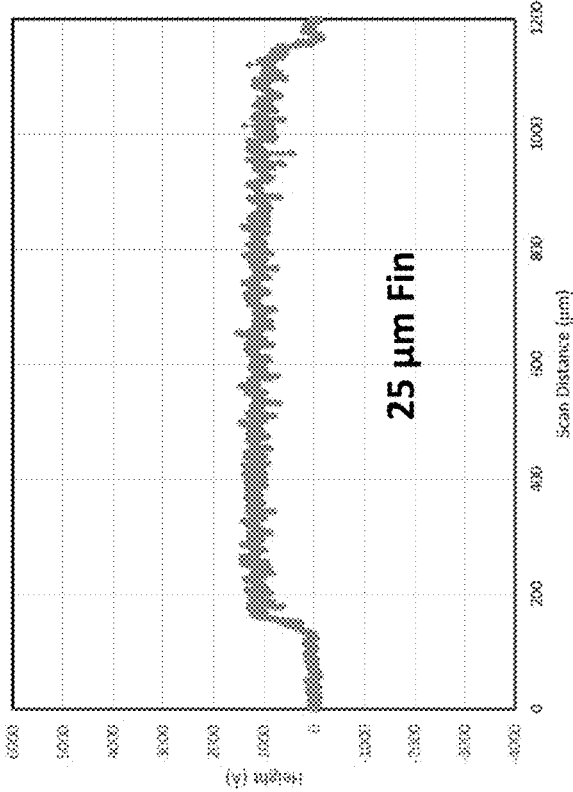
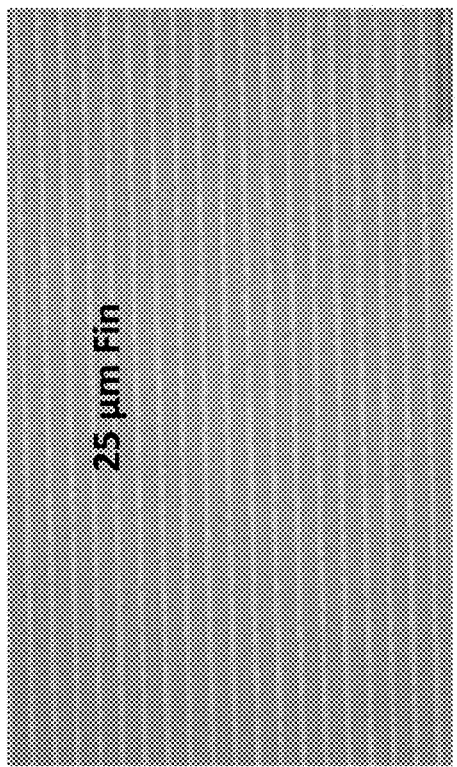
FIG. 11A

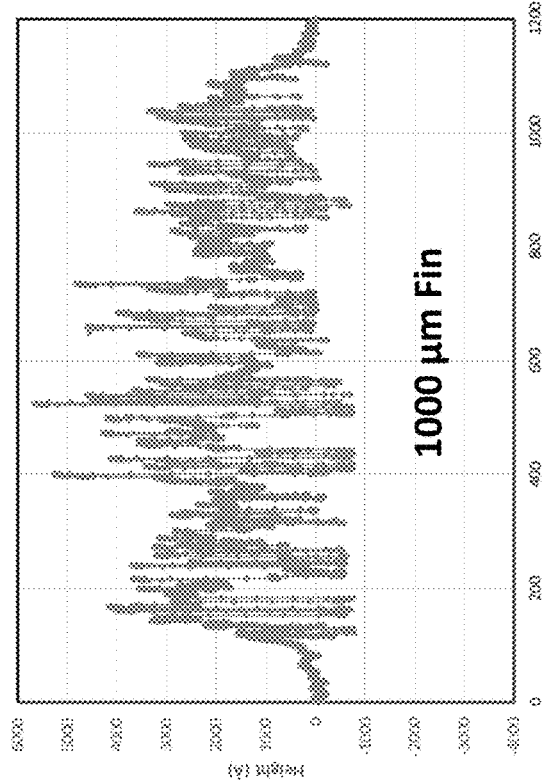
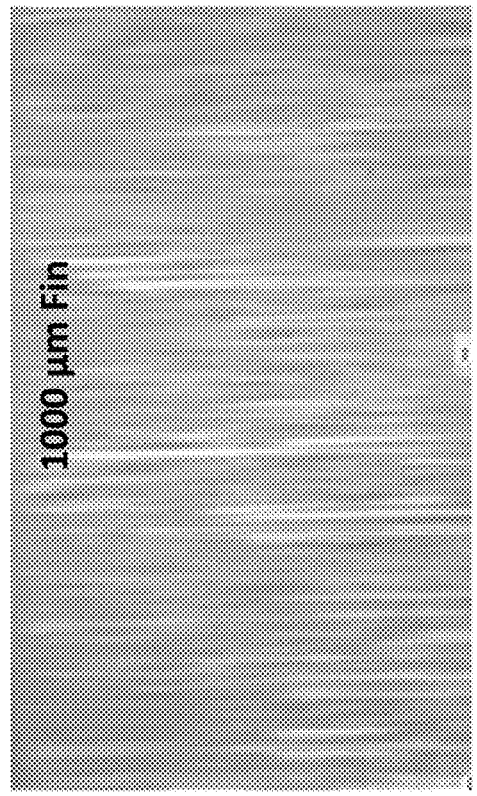
FIG. 11C
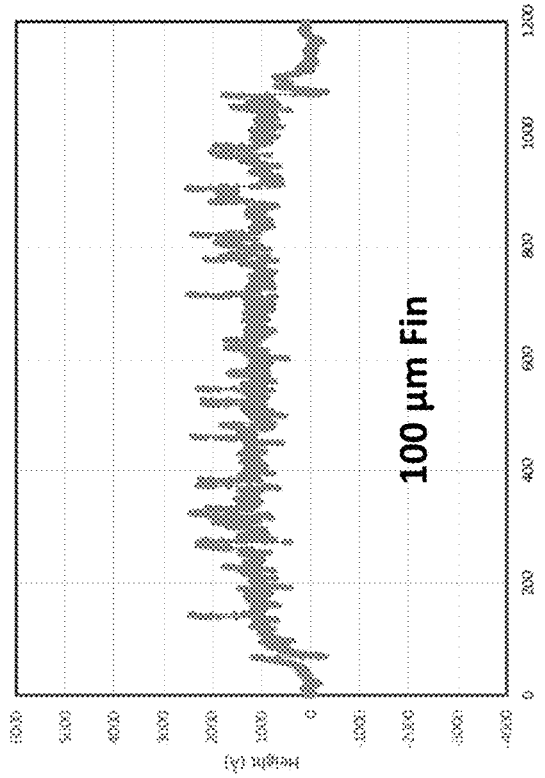
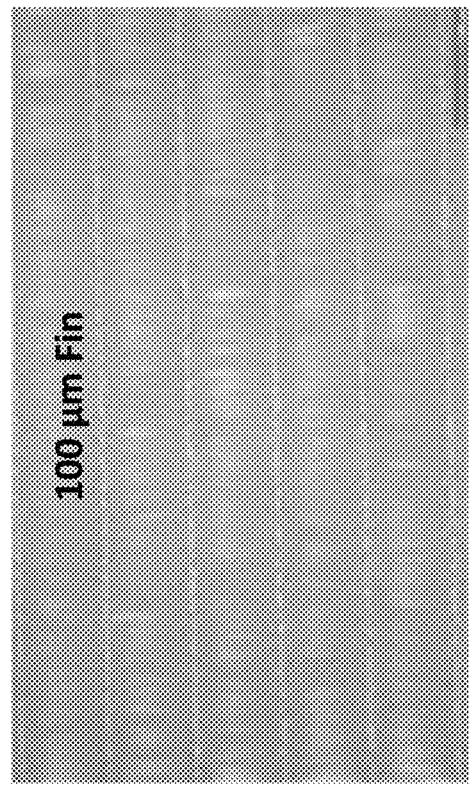
FIG. 11D

REGROWTH UNIFORMITY IN GAN VERTICAL DEVICES

CROSS-REFERENCES TO RELATED APPLICATIONS

This application claims priority to U.S. Provisional Patent Application No. 62/956,467, filed on Jan. 2, 2020, entitled "Regrowth Uniformity in GaN Vertical Devices," the disclosure of which is hereby incorporated by reference in its entirety for all purposes.

BACKGROUND OF THE INVENTION

Power semiconductor devices including transistors and diodes are widely used today in such applications as industrial power supplies, motor drives, consumer electronics, etc. A common application of power semiconductor transistors is their use as switches in switch-mode power supplies or motor drives. In such applications, the parasitic resistance of the switch, as well as the switch speed, are important to efficiency of the power supply or motor drive.

Despite the progress made in the field of power semiconductor devices, there is a need in the art for improved methods and systems related to regrowth uniformity.

SUMMARY OF THE INVENTION

The present invention relates to semiconductor manufacturing technology, and particularly, to a semiconductor structure and method of forming and uniformly regrowing large arrays of gate regions in vertical fin-based FET structures. One such semiconductor structure includes a fin array having a plurality of fins surrounding by a recess region that is filled with an epitaxially regrown gate layer, the epitaxially regrown gate layer having a substantially uniformly planar surface overlying the entire recess region.

In one aspect of the present disclosure, a semiconductor device may include a semiconductor substrate having a first conductivity type, a drift layer of the first conductivity type coupled to the semiconductor substrate, a fin array having a first row of fins and a second row of fins on the drift layer, and a space between the first row of fins and the second row of fins. The first row of fins includes a plurality of first elongated fins arranged in parallel to each other along a first row direction and separated by a first distance, and the second row of fins includes a plurality of second elongated fins arranged in parallel to each other along a second row direction and separated by a second distance.

The first portion of the first elongated fins and the first portion of the second elongated fins in the first column can have a first length twice a second length of the second portion of the first elongated fins and the second portion of the second elongated fins in the second column. In another embodiment, the first portion of the first elongated fins and the first portion of the second elongated fins in the first column can have a first length half a second length of the second portion of the first elongated fins and the second portion of the second elongated fins in the second column. The plurality of first elongated fins and the plurality of second elongated fins can have the same lengths or can have unequal or non-uniform lengths.

In another aspect of the present disclosure, a method for forming a semiconductor device may include providing a substrate structure having a semiconductor substrate of a first conductivity type, a drift layer on the semiconductor substrate, a fin array on the drift layer and surrounded by a recess region. The fin array includes a first row of fins and a second row of fins parallel to each other and separated from each other by a space, the first row of fins includes a plurality of first elongated fins extending parallel to each other in a first direction and arranged with a first distance between each other, and the second row of fins includes a plurality of second elongated fins extending parallel to each other in a second direction parallel to the first direction and arranged with a second distance between each other.

The method may further include epitaxially regrowing a gate layer of a second conductivity type opposite the first conductivity type on the drift layer filling the recess region, the gate layer surrounding the first row of fins and the second row of fins.

Numerous benefits are achieved by way of the present invention over conventional techniques. For example, embodiments of the present invention utilize a fin array having a plurality of rows of fins and a plurality of columns of fins that are arranged in predetermined physical layouts across the substrate to obtain a uniformly planar surface of an epitaxially regrown semiconductor layer in relation to the upper surface of the fins (i.e., FinFET structures).

Embodiments of the present invention provide a semiconductor structure and method of manufacturing the same that provide uniform regrowth of the gate layer. A planar regrown gate layer can reduce the variation of the thicknesses on different gates, hence, the variation of the gate resistivity, and equal channel lengths among the fin-based FET structures improve semiconductor device reliability. These and other embodiments of the present invention along with many of its advantages and features are described in more detail in conjunction with the text below and attached figures.

BRIEF DESCRIPTION OF THE DRAWINGS

FIG. 7A shows growth thickness variations on a 600 nm regrowth wafer according to an embodiment of the present disclosure;

FIG. 7B shows growth thickness variations on an 800 nm regrowth wafer according to an embodiment of the present disclosure;

FIGS. 11A-11D are Nomarski-contrast micrograph images illustrating and the variation (standard deviation sigma, range) of 25 µm, 50 µm, 100 µm, and 1000 µm fin lengths, respectively, on an 800 nm regrowth wafer according to an embodiment of the present disclosure;

DETAILED DESCRIPTION OF THE INVENTION

Figure 1:
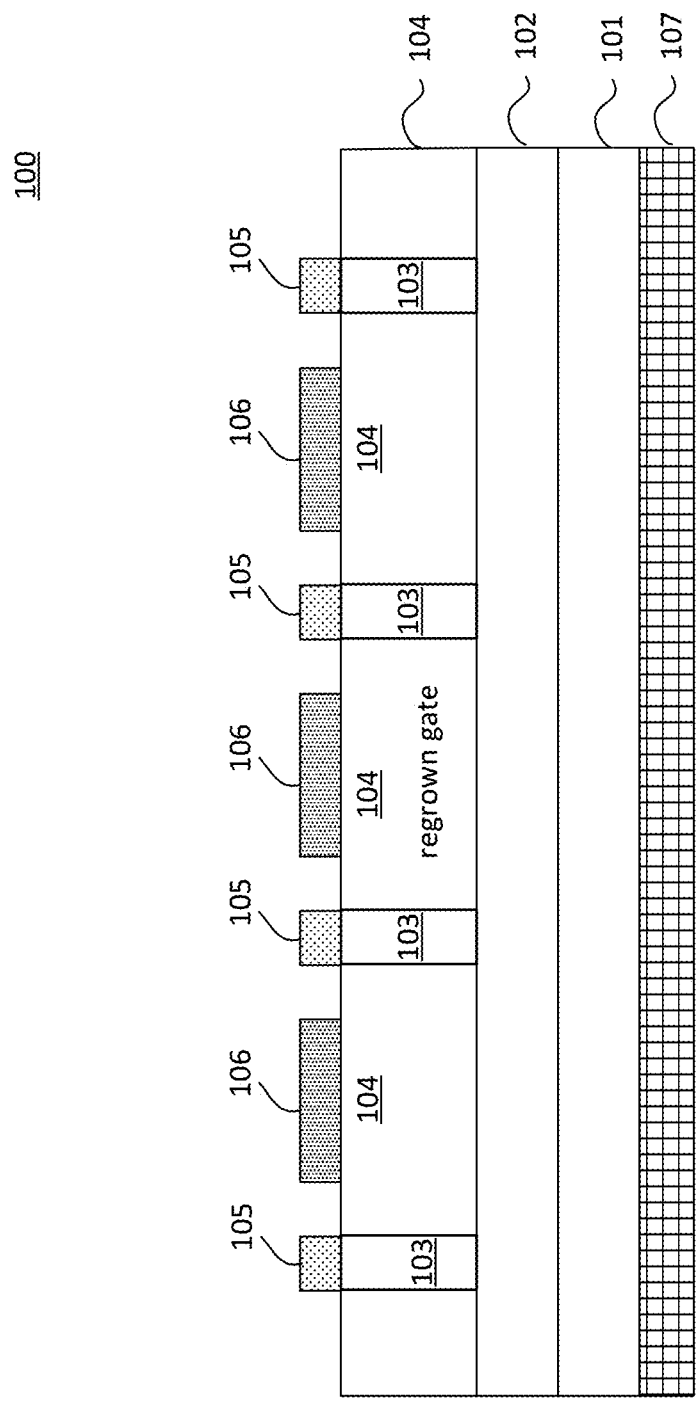
FIG. 1 is a simplified cross-sectional view illustrating a semiconductor device according to an embodiment of the present disclosure.

The present invention relates to semiconductor manufacturing technology, and particularly, to a semiconductor structure and method of forming and uniformly regrowing large arrays of gate regions in vertical FET transistors. Such a vertical fin-based FET transistor structure is described in U.S. Pat. No. 9,117,839 to Kiziyalli, et al. (the "'839 structure"). In the '839 structure, the transistor conducting channel is formed using a semiconductor fin formed by patterning and etching surrounding material to a certain depth. A semiconductor material with an opposite doping type is epitaxially regrown (e.g., using metalorganic vapor phase epitaxy, or MOVPE) to be substantially planar to the top of the semiconductor fin. The regrown material servers as the gate electrode of a vertical FET, and application of control voltages to the gate electrode modulates the conduction of current in the vertical fin channel between the top of the fin ("source") and bottom of the fin (normally, the drift region which is further connected to the "drain" electrode via the semiconductor substrate).

The channel length of the FET is determined by the height (thickness) of the regrown gate region along the sidewall of the vertical fin. In a typical switching transistor, many fins are arranged in rows and columns of a large x by y array, with all fins aligned in the same crystallographic direction. Such an array may contain hundreds to tens of thousands of parallel fins.

The regrowth of the gate material requires a technique known in the art as selective area growth, since the desired epitaxial growth occurs in the region between the fins, and no growth is desired on tops of the fins, which are protected by a hard mask.

The epitaxial growth rate of selective area growth is known to be affected by a number of parameters, including the relative areas of the hard mask and the regrowth regions. The selective epitaxial growth of nitride semiconductor is described in the publication "Selective Area Metal-Organic Vapor Phase Epitaxy of Nitride Semiconductors for Multi-color Emission" by Tomonari Shioda et al. IEEE Journal of Selected Topics in Quantum Electronics, 2009, which is hereby incorporated by reference in its entirety.

Techniques for creating uniform selective growth involve creating regular arrays of openings of roughly equi-axial shape (e.g., round holes, hexagonal annuli) in a large hard mask. In such a design, the hard mask is comparable or larger in area to the opening where epitaxial growth takes place.

The vertical fin-based FET device structure array may be formed using a hard mask that is typically <30% of the total surface area. Further, the hard mask has a very elongated rectangular shape, where the length/width ratio of the rectangle is typically >50:1. Additionally, the array can extend more than one mm in each direction, and the desired non-uniformity of regrowth across this region is <2% of the nominal regrowth thickness.

The present inventors have found that the local uniformity of the growth (the uniformity of the height (thickness) of the regrowth between fins from gate region to gate region) is further determined by the physical layout of the fin array, and in particular, the length of the fins in the long dimension relative to a characteristic length determined by the regrowth condition. Accordingly, the present inventors provide an optimal method to create a fin array design to achieve the best uniformity of gate regrowth, and thus to achieve minimum variation in channel lengths between the different fins in the array across a large area.

As described above, for a given threshold voltage, a vertical JFET channel conductance improves as the thickness (or height) of the conducting channel (i.e., the vertical fin) decreases. In order to obtain a large drive current, the fin array includes a plurality of vertical fins, contacts that are just the size of the width of the vertical fins (e.g., self-aligned contacts) are desired. Formation of such contacts requires good control of the local topography of the surface, as will be illustrated in detail below.

In order to reduce the resistance of the switch and reduce parasitic capacitances that limit switch speed, an increased conductance per unit area is desirable. Switch transistors in which the current flow is primarily vertical offer reduced resistance per area. This benefit can be further improved by arranging the control channel of the transistor to lie in the vertical direction, e.g., a "trench" channel transistor. The resistance of the transistor has several components, including the resistance of the transistor channel (the region where current is directly controlled by the input gate voltage), the resistance of the "drift" region (the region designed to hold the breakdown voltage of the transistor), and the resistance of the starting substrate, contacts, metals, etc.

Improvements in switch resistance and capacitance can be made by changing the semiconductor material from silicon to a wide bandgap material such as gallium nitride, which offers a higher critical field for breakdown. The higher critical electrical field allows the high-voltage drift region of the device to be made thinner and more heavily doped than with similar silicon devices, reducing the specific resistance (resistance×area) of the drift region, and the device on-resistance for a given die size.

The channel resistance of a transistor needs to be reduced to meet improvements in the specific resistance of the drift region to avoid limiting the switch performance. For gallium nitride devices, this involves providing dense arrays of switch transistor channels with good control on the vertical length of the channel (the control region in the vertical direction, which determines the channel on-resistance). Similarly, for a given threshold voltage, a vertical JFET channel conductance improves as the width of the conducting channel decreases, since the doping concentration must increase as $\sim\sqrt{(1/W_{channel})}$, where $W_{channel}$ is the width of the channel in the vertical direction.

FIG. 1 is a simplified cross-sectional view illustrating a semiconductor device 100 according to an embodiment of the present disclosure. Referring to FIG. 1, semiconductor device 100 includes a semiconductor substrate 101 (which may form a drain of a JFET device), an epitaxial drift region 102 on semiconductor substrate 101, a plurality of fins 103 on epitaxial drift region 102, and a regrown gate region 104 surrounding the plurality of fins 103. Semiconductor device 100 further includes a source metal layer 105 on an upper surface of the plurality of fins 103, a gate metal layer 106 on regrown gate region 104, and a drain metal layer 107 on the bottom surface of semiconductor substrate 101. In one embodiment, the upper surface of regrown gate region 104 is substantially flush with the upper surface of the plurality of fins 103.

In one embodiment, the semiconductor substrate is an n+ doped substrate, the epitaxial drift region is an n− doped region, the fins include an n doped semiconductor material, and the regrown gate region is a p doped region. The notations "n+", "n", and "n−" indicate the relative dopant concentrations among the semiconductor substrate, the fins, and the epitaxial drift region. In this embodiment, the n doped fins have an n-type dopant concentration greater than the n− doped epitaxial drift region, and the semiconductor substrate is doped more heavily than the n doped fins. Actual dopant concentrations can vary widely depending on the selected semiconductor material and the voltage class of the semiconductor device. In some embodiments, the n+ doped semiconductor substrate may be an n+ doped III-nitride substrate with N-type dopants in the range of about $5\times10^{17}$ atoms/cm$^3$ to about $1\times10^{20}$ atoms/cm$^3$, the n− doped epitaxial drift region may have a dopant concentration in the range of about $1\times10^{16}$ atoms/cm$^3$ to about $1\times10^{17}$ atoms/cm$^3$, the n doped fins may have a dopant concentration in the range of about $1\times10^{17}$ atoms/cm$^3$ to about $1\times10^{18}$ atoms/cm$^3$. In one embodiment, the source metal layer, the gate metal layer, and the drain metal layer each may include TiN.

Figure 2A:
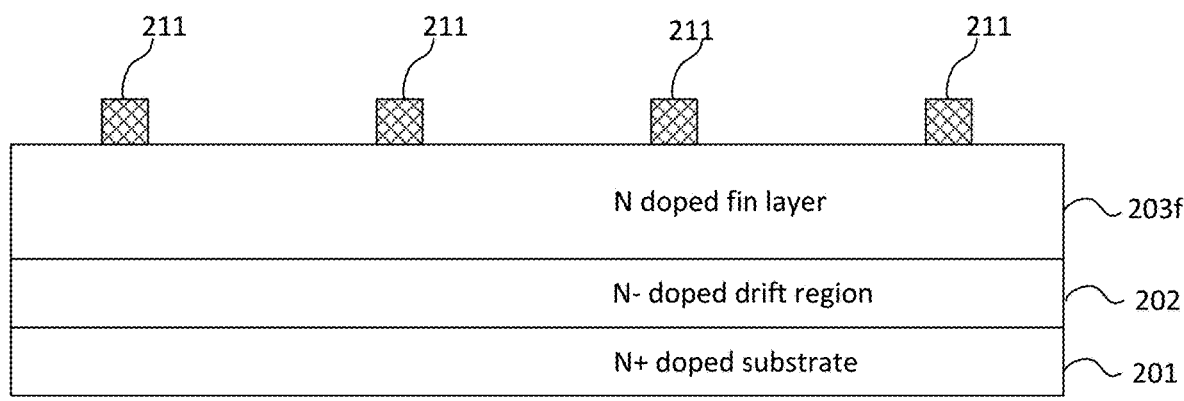
FIGS. 2A-2D are simplified cross-sectional views illustrating the fabrication of a semiconductor device including a plurality of semiconductor fins surrounding by a plurality of regrown gates according to an embodiment of the present disclosure.

FIGS. 2A-2D are simplified cross-sectional views illustrating the fabrication of a semiconductor device 200 including a plurality of semiconductor fins having a plurality of regrown gates according to an embodiment of the present disclosure. Referring to FIG. 2A, an n+doped semiconductor substrate 201 is provided, an n− doped semiconductor layer 202 is epitaxially grown on n+ doped semiconductor substrate 201, and an n doped semiconductor layer 203f is epitaxially grown on n− doped semiconductor layer 202. In one embodiment, n− doped semiconductor layer 202 forms the drift region of the semiconductor device and is doped with n− type dopants, such as nitrogen. A patterned hard mask layer 211 is formed on n doped semiconductor layer 203f. The patterned hard mask layer may include silicon dioxide or silicon nitride. In one embodiment, the patterned hard mask layer may be formed by PECVD. In another embodiment, the patterned hard mask layer may be formed using RIE with fluorine-based chemistry. In one embodiment, the patterned hard mask layer may include a refractory metal, metal alloy, or metal nitride (e.g., TiN) in contact with the surface of N-doped semiconductor layer 203f. In one embodiment, n+doped semiconductor substrate 201 may be an n+doped III-nitride compound substrate. Although embodiments of the present invention are described in relation to one or more of the semiconductor layers being formed "on" an underlying layer, it will be appreciated that additional epitaxial layers, including buffer layers, adhesion layers, and the like can be present between the layers illustrated herein. Additionally, although epitaxial layers are described herein in terms of a single layer, this is not required by embodiments of the present invention and the various epitaxial layers, including the regrown epitaxial material, can include multiple sub-layers. Thus, complex epitaxial structures are provided including both multiple epitaxial layers and/or multiple layers of regrown material either deposited directly on the underlying layer or including one or more additional layers between adjacent layers illustrated in the drawings.

Figure 2B:
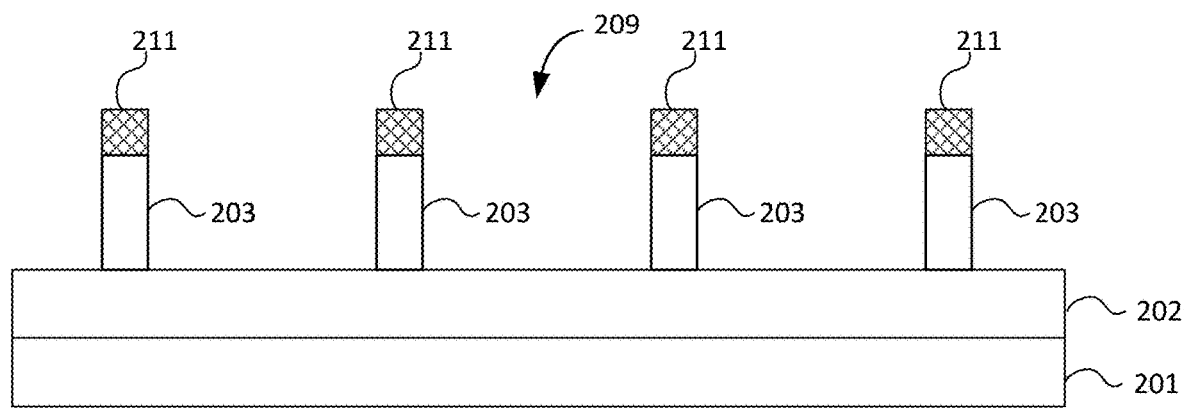

FIG. 2B is a cross-sectional view illustrating the semiconductor device structure after an etch process has been performed to obtain a plurality of semiconductor fins 203 that are separated by a recess region 209. It is noted that the bottom of the fins may have a shape different from the shape shown in FIG. 2B after the etch process. Embodiments of the present invention are described herein with reference to cross-sectional illustrations that are schematic illustrations of idealized embodiments and intermediate structures of the invention. The thickness of layers and regions in the drawings may not be drawn to scale for purposes of clarity. Variations from the shapes of the illustrations as a result, for example, of manufacturing techniques and/or tolerances, are expected. Thus, embodiments of the invention should not be construed as limited to particular shapes of regions illustrated herein, but are to include deviations in shapes that result from manufacturing. In the following drawings, the bottom portion of the fins are shown as having a 90 degrees angle with the surface of the drift region, i.e., the fins are shown as having a rectangular cross-sectional shape. It is understood that the bottom portion of the fins may have rounded or curved features. Thus, the regions illustrated in the figures are schematic in nature and their shapes are not intended to illustrate the actual shape of a region of the device and are not intended to limit the scope of the invention.

Figure 2C:
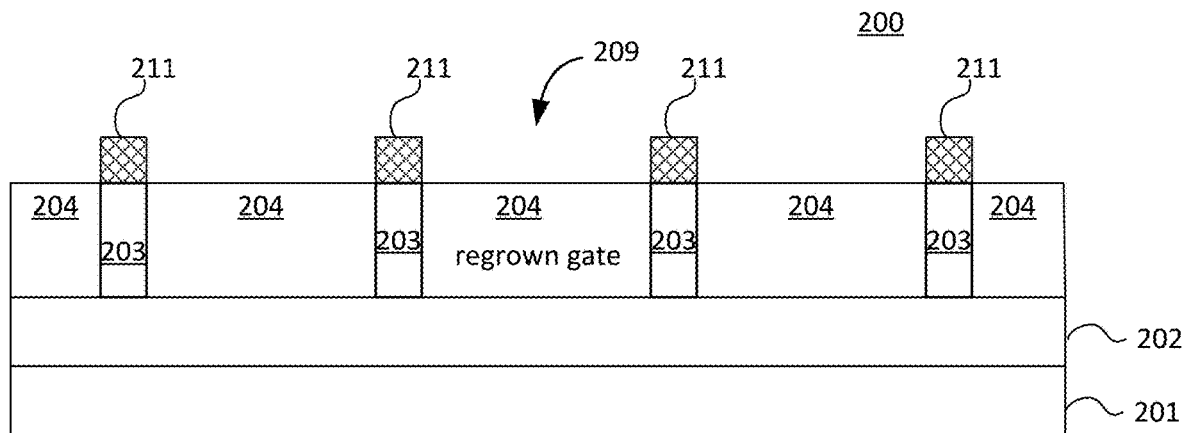

FIG. 2C is a cross-sectional view illustrating the device structure after a gate region 204 has been epitaxially regrown in recess region 209. In one embodiment, regrown gate region 204 may include a p-type III-nitride layer that is epitaxially and uniformly grown in the recess region up to a thickness that is substantially planar with the upper surface of fins 203. In one embodiment, the p-type III-nitride layer may be doped with Mg with a dopant concentration of about $1\times10^{19}$ atoms/cm$^3$. In one embodiment, an annealing process may be carried out to activate the Mg dopant in an amount of greater than 10 percent by weight. The patterned hard mask layer is then removed. In one embodiment, where the hard mask layer includes one or more of a refractory metal, metal alloy, or metal nitride ("the hard mask metal layer"), the hard mask metal layer may be left in place.

Figure 2D:
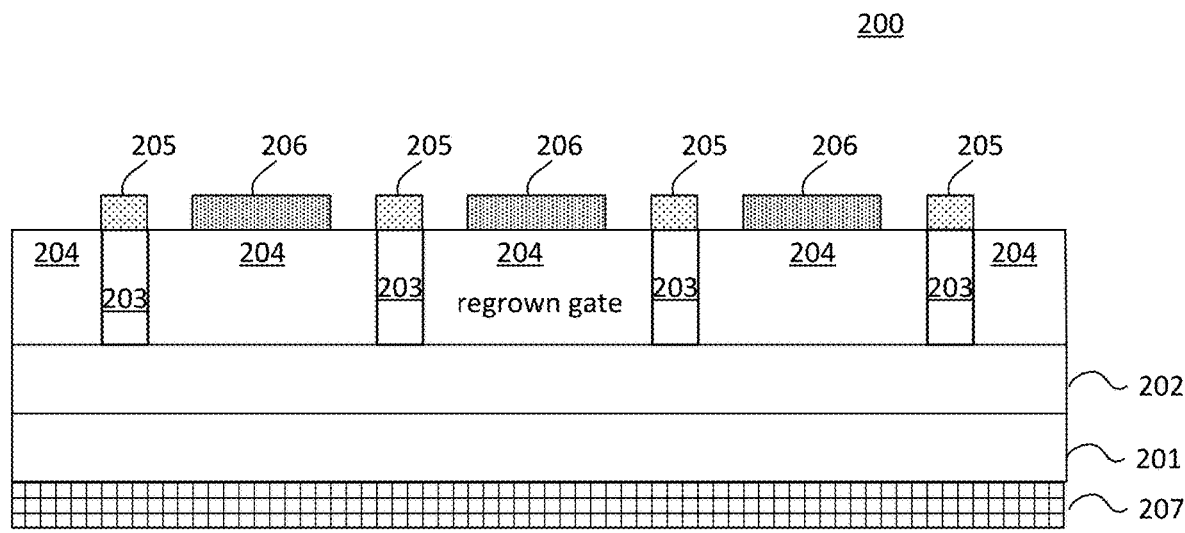

FIG. 2D is a cross-sectional view illustrating the semiconductor device structure after a source metal layer 205 is formed on the upper surface of fins 203 and a gate metal layer 206 is formed on regrown gate region 204. In one embodiment, a drain metal layer 207 may also be formed on the bottom surface of semiconductor substrate 201.

Figure 3:
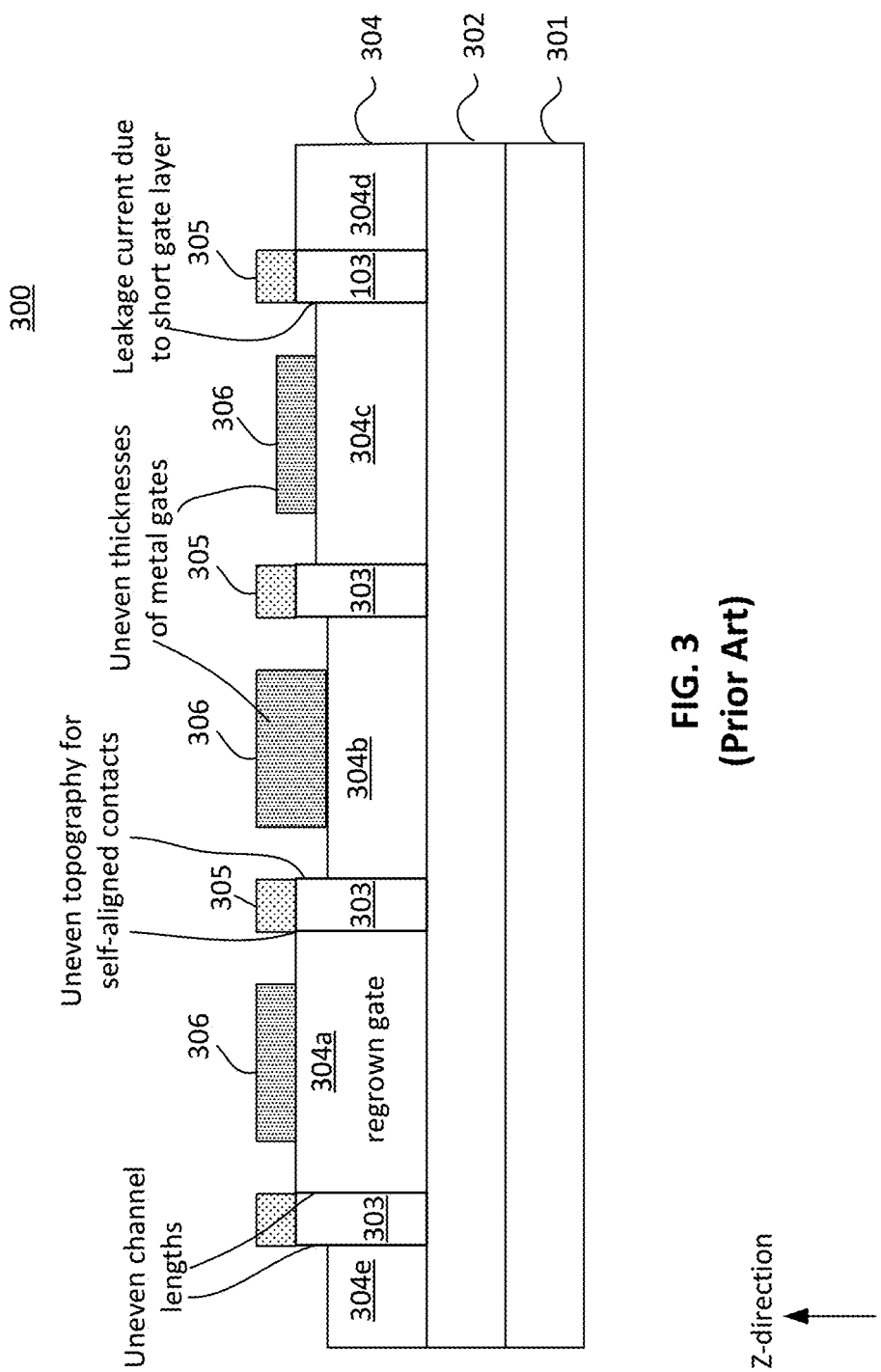
FIG. 3 is a simplified cross-sectional view illustrating variations of the regrown gates along sidewalls of the semiconductor fins.

FIG. 3 is a simplified cross-sectional view illustrating variations of the regrown gates along sidewalls of the semiconductor fins. Referring to FIG. 3, a semiconductor device 300 includes a substrate 301, a drift region 302 on substrate 301, a plurality of fins 303 on drift region 302, a regrown gate region 304 on drift region 302 and surrounding the fins. Due to layout design and/or photolithography and/or etch process variations, the fins may have different heights, and/or the regrown gates have different heights (thicknesses). In the example shown in FIG. 3, regrown gate region 304 includes a first regrown gate 304a having an upper surface substantially flush with an upper surface of fins 303, a second regrown gate 304b having an upper surface lower than the upper surface of fins 303, third regrown gate 304c having an upper surface lower than the upper surface of the fins 303, fourth regrown gate 304d having an upper surface substantially flush with the upper surface of fins 303, and a fifth regrown gate 304e having an upper surface lower than the upper surface of the fins 303. The non-uniform thickness (or height measured normal to the surface of substrate 301) of the regrown gate region may require additional treatments prior to contact formation. Without additional treatments to obtain thickness uniformity of the regrown gate region, the non-uniform thickness may cause one or more of the following problems: the gate metal layer has different thicknesses for different gates (304a, 304b, 304c) that causes the metal gate resistivity to vary; unequal channel lengths that cause a high concentration of the current on the short regrown gate area (e.g., a hot spot) that may exceed the maximum permissible temperature value and reduce the device reliability; uneven topography for self-aligned contacts, and higher leakage current.

Figure 4A:
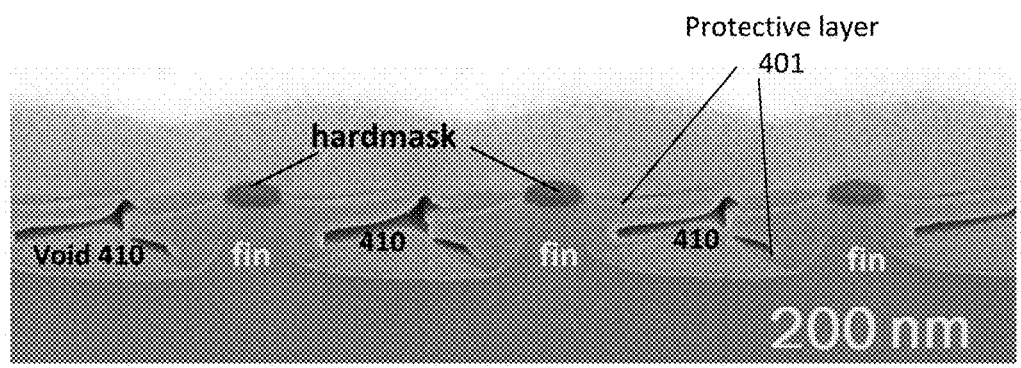
FIGS. 4A-4G show results of regrowth profiles on respective 200 nm, 400 nm, 500 nm, 550 nm, 600 nm, 650 nm, and 800 nm regrowth wafers according to an embodiment of the present disclosure.

FIGS. 4A-4H show experimental results of regrowth profiles on respective 200 nm, 400 nm, 500 nm, 550 nm, 600 nm, 650 nm, and 800 nm regrowth wafers according to an embodiment of the present disclosure. FIG. 4A is an SEM image showing a vertical regrowth profile of a semiconductor layer in a recess between adjacent semiconductor fins on a 200 nm regrowth substrate in a 1.8/2.0 (trench width/fin pitch) fin array. Voids 410 are present under the lateral portion at the 200 nm regrowth process. These voids 410 are in a protective layer that is needed only to protect the structure for the focused ion beam (FIB) measurement and characterization process. The voids 410 and the protective layer are not present in the normal process, and occur only as a result of the preparative measure for the FIB procedure.

Figure 4B:
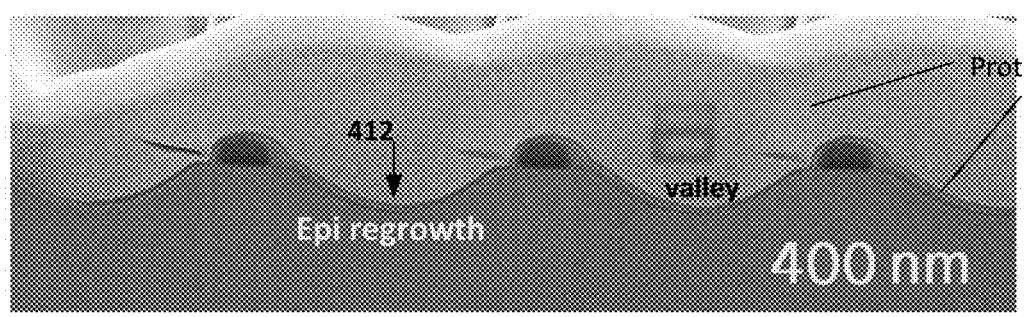

FIG. 4B is an SEM image showing a vertical regrowth profile of a semiconductor layer in a trench between adjacent semiconductor fins on a 400 nm regrowth substrate in a 1.8/2.0 (trench width/fin pitch) fin array. For this 400 nm regrowth, a valley 412 between adjacent semiconductor fins is present. It is noted that a layer 401 is present over the hard mask. Layer 401 is a protective layer that is needed only to protect the structure for the FIB process. Layer 401 is not present in the regrowth process, it is only needed as a result of the preparative measure for the FIB procedure.

Figure 4C:
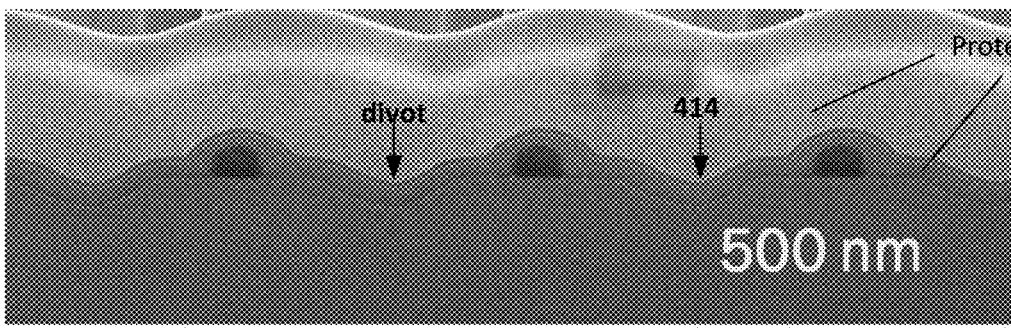

FIG. 4C is an SEM image showing a vertical regrowth profile of a semiconductor layer in a trench between adjacent semiconductor fins on a 500 nm regrowth substrate in a 1.8/2.0 fin array. Divots 414 between adjacent semiconductor fins are present.

Figure 4D:
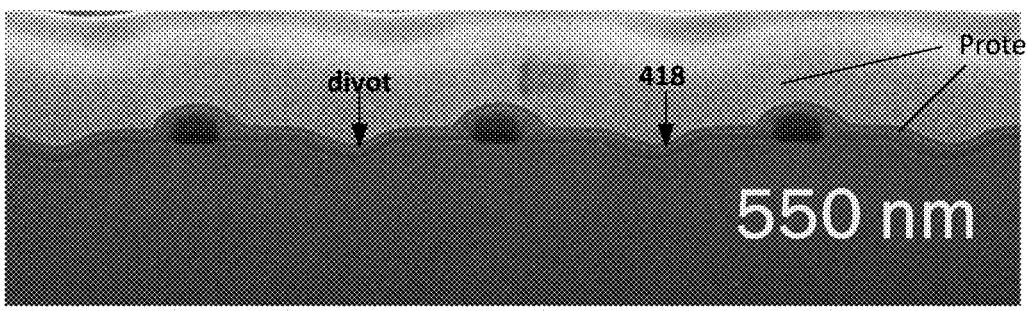

FIG. 4D is an SEM image showing a vertical regrowth profile of a semiconductor layer in a trench between adjacent semiconductor fins on a 550 nm regrowth substrate in a 1.8/2.0 fin array. Divots 418 between adjacent semiconductor fins still can be seen. Comparing divots 418 to divots 414 shown in FIG. 4C, divots 418 are less deep. It can also be seen that the depth of divots 414, 418 shown in FIGS. 4C and 4D is smaller in the lateral and vertical directions than the valleys 412 shown in FIG. 4B. The regrowth layer between the fins on the 550 nm regrowth substrate almost achieves a planar surface. Layer 401 is a protective layer for the FIB processing. The artifact layer 401 is not required according to embodiments of the present disclosure.

Figure 4E:
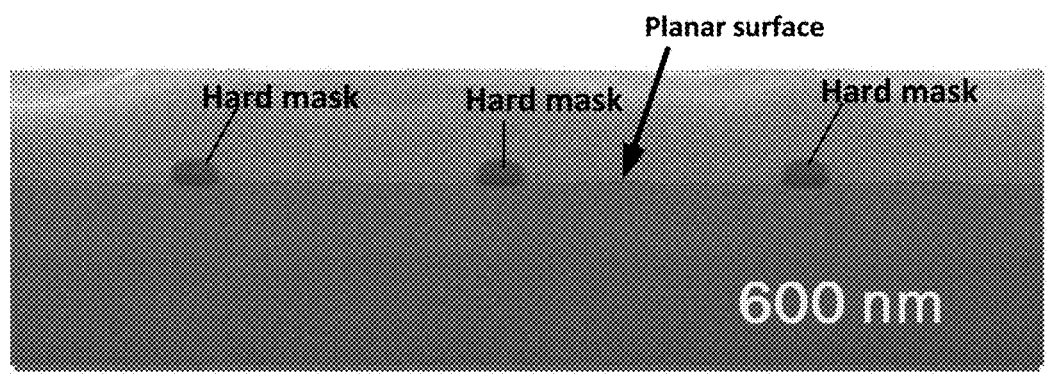

FIG. 4E is an SEM image showing a vertical regrowth profile of a semiconductor layer in a recess between adjacent semiconductor fins on a 600 nm regrowth substrate in a 1.8/2.0 fin array. The upper surface of the regrown semiconductor layer is substantially planar and flush with the bottom surface of the hard mask.

Figure 4F:
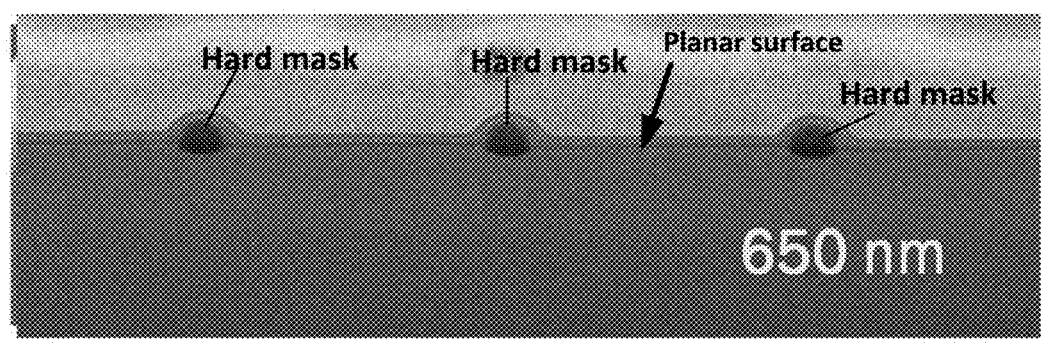

FIG. 4F is an SEM image showing a vertical regrowth profile of a semiconductor layer in a trench between adjacent semiconductor fins on a 650 nm regrowth substrate in a 1.8/2.0 fin array. The upper surface of the regrown semiconductor layer is substantially planar and above the bottom surface of the hard mask. Therefore, the inventors believe that a regrowth thickness between 550 nm and 650 nm, for the initial etched trench depth in this example, can provide an acceptable planar surface for the semiconductor layer. Of course, one of ordinary skill in the art would recognize many variations, modifications, and alternatives. In one embodiment, the regrowth thickness in the active device region depends on the etch depth and the width ratio between the hard mask and the trench. In another embodiment, the flatness of the regrowth of the semiconductor layer in the active device region depends on the trench depth and the ratio between the fin width and the trench width. In one embodiment, the active device region has a trench depth of about 0.8 µm, the trench width of about 1.8 µm, and the hard mask width of about 0.2 µm (i.e., the fin width is about 0.2 µm), so that the width ratio between the trench and the hard mask in the active device region is 0.9 (1.8/0.2) to obtain a planar surface of the regrowth semiconductor layer at a regrowth thickness between 550 nm and 650 nm.

Figure 4G:
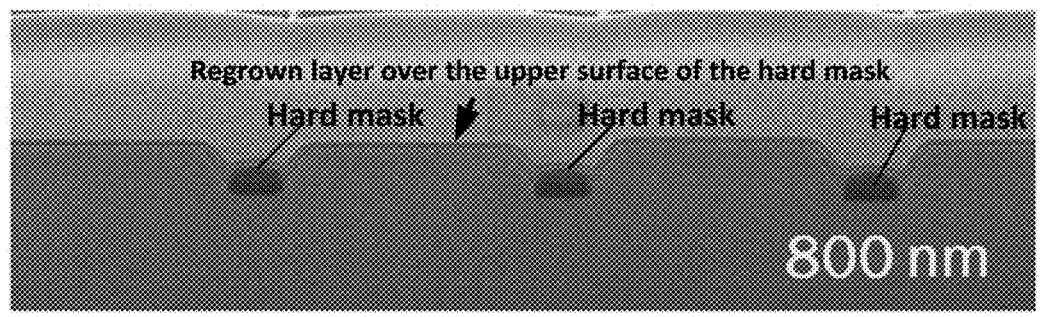

By performing additional epitaxial regrowth of the semiconductor layer to produce a thicker regrowth layer, the regrown semiconductor layer will protrude over the upper surface of the hard mask layer, as shown in FIG. 4G. The present inventors believe that a regrowth thickness between 550 nm and 650 nm can provide an acceptable planar surface for the semiconductor layer.

Figure 5:
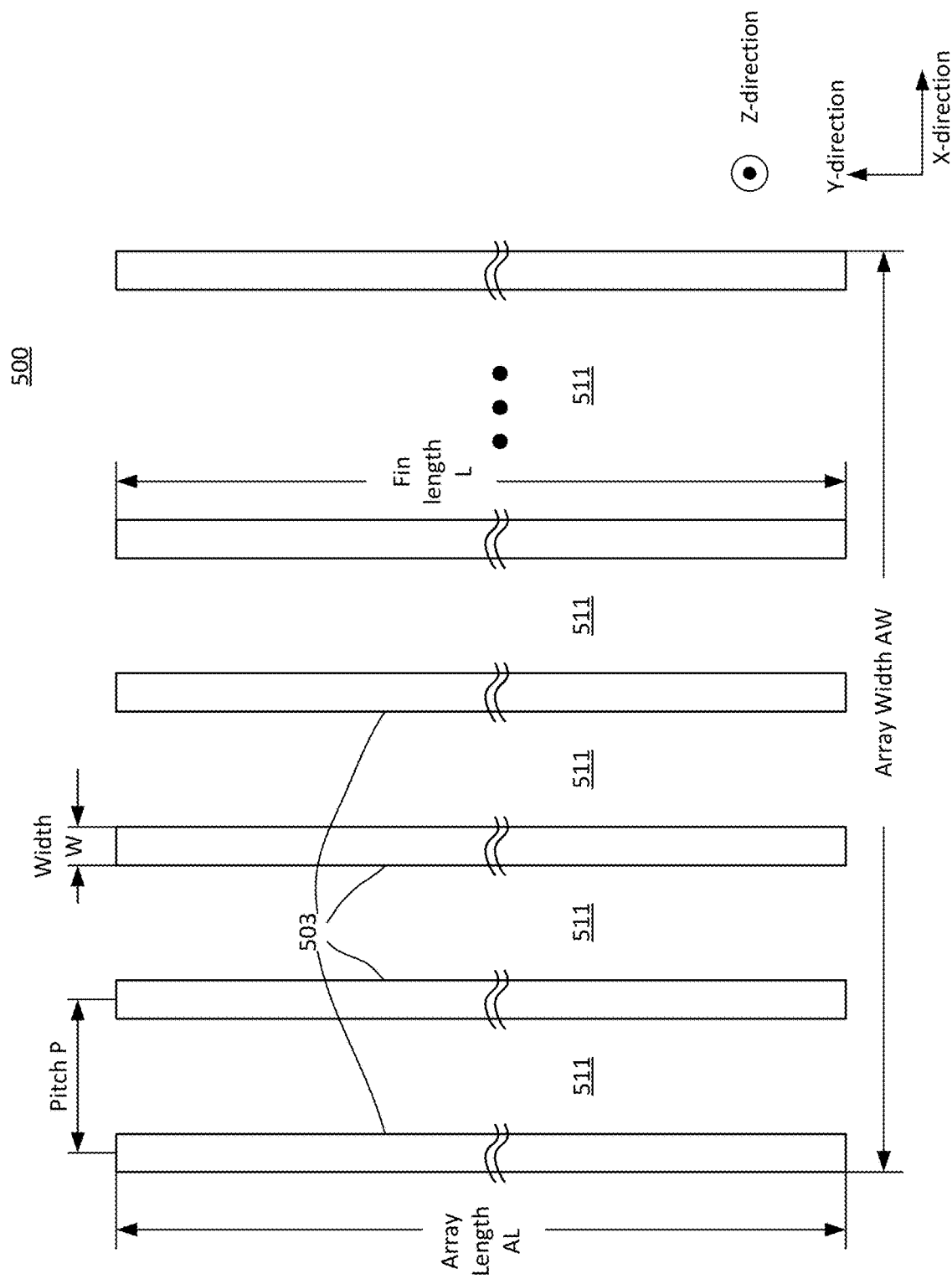
FIG. 5 is a plan view of a fin pattern layout for explaining the terms that are used in the present disclosure.

FIG. 5 is a plan view of a fin pattern layout for explaining the terms that are used in the present disclosure. Several terms will be described and/or defined to facilitate a better understanding of the present disclosure. Referring to FIG. 5, an array of fins (i.e., a fin array) 500 includes a plurality of elongated fins 503 that are separated from each other by a patterned recess region 511. The distance between two adjacent elongated fins is referred to as a pitch P. Each elongated fin has a width W and a length L, which, in the case of a single fin in the Y-direction, is also referred to as the fin array length AL. In one embodiment, the elongated fin has a width of 0.2 µm and a length of 1000 µm. In one embodiment, the pitch between two adjacent elongated fins is about 2 µm, and the depth of the patterned recess region is about 0.7 µm to 0.8 µm. A long fin is referred to as a fin having a length greater than 100 µm, e.g., 700 µm, 1000 µm. An elongated fin is referred to a bar-shaped fin that has a length that is greater than 10 times the width of the fin. Referring to FIG. 5, the bar-shaped fins are arranged in parallel to each other in the X-direction and extend along the Y-direction. The depth of the patterned recess region and the height of the fins extend in the Z-direction out of the surface of the fin array (i.e., the X-Y plane). Referring to FIG. 3, the normal to the substrate surface is aligned with the z-axis.

Figure 6:
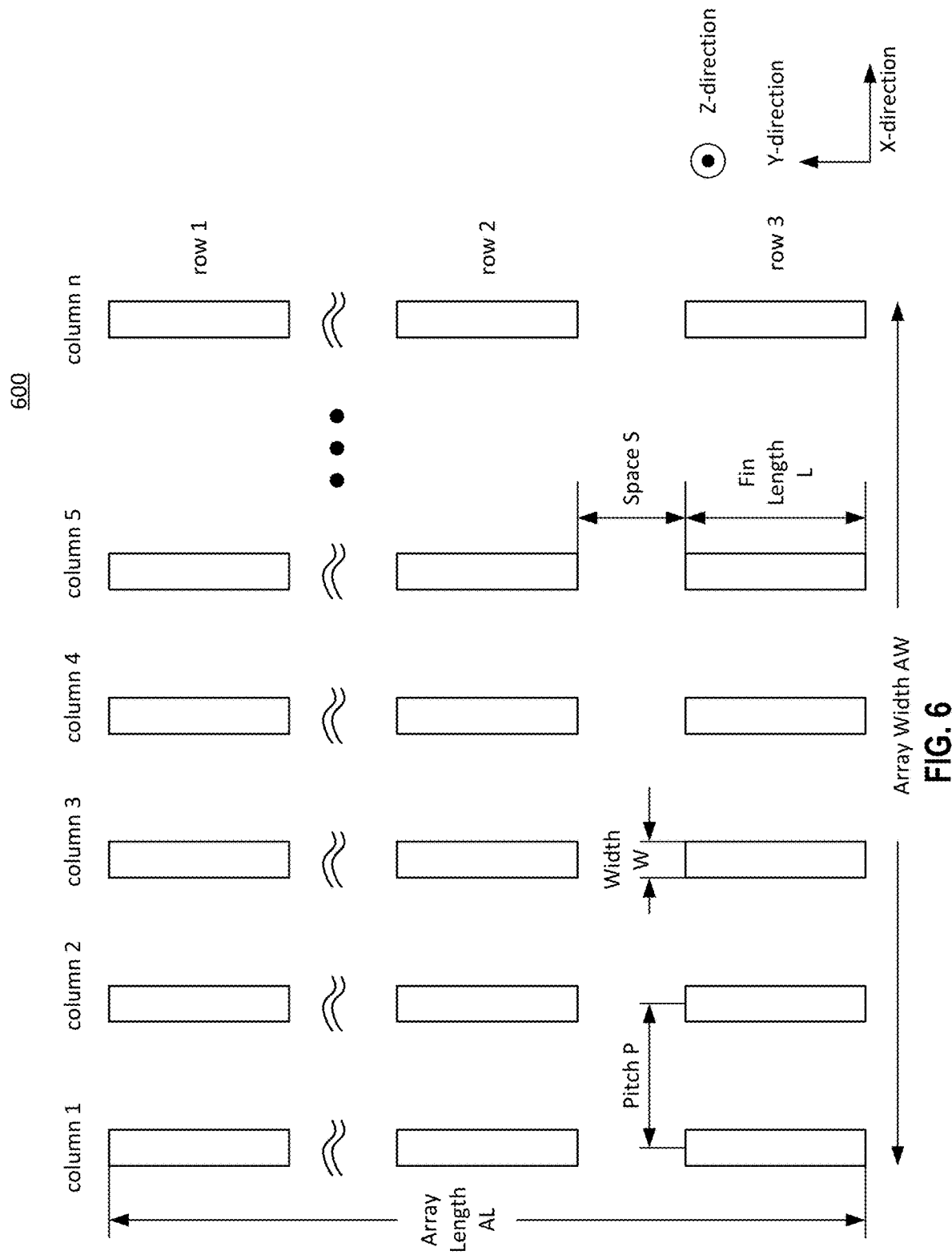
FIG. 6 is a plan view of a fin pattern layout illustrating semiconductor fins having shorter lengths according to an embodiment of the present disclosure.

FIG. 6 is a plan view of a fin pattern layout illustrating a fin array 600 having a plurality of semiconductor fins having short lengths according to an embodiment of the present disclosure. A short fin is referred to as a bar-shaped fin having a length smaller than 100 µm, e.g., 50 µm, 25 µm. In other words, a short fin is formed by breaking up a long fin into multiple small fin segments. For example, a long fin of 1000 µm length can be divided into 40 short fins each having a 25 µm length. Referring to FIG. 6, fin array 600 includes a plurality of short fins arranged in a plurality of rows (row 1, row 2, row 3) and in a plurality of columns (column 1, column, 2, . . . , column n). The short fins in each row are separated from each other by a pitch P. Each row is separated from each other by a space S (i.e., the gap between each row). The total length of the array is now related to the individual fin length L, the number of rows N, and the space S by AL=N*L+(N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 6, six short fins ae used in each row, three rows and six columns are shown, but it is understood that the number of short fins and the number of rows and columns are arbitrarily chosen for describing the example embodiment and should not be limiting.

In one exemplary embodiment, the fin length L is about 25 µm, the fin width W is about 0.2 µm, the fin thickness or fin height measured along the z-direction is about 0.8 µm, the pitch P is in the range between 1.5 µm and 2.5 µm. In one embodiment, a ratio between a fin width W and a pitch P between two adjacent fins is in the range between about 0.08 and 0.13, preferably in the range between 0.1 and 0.12. In one embodiment, a ratio between a fin length L and the pitch P between two adjacent fins is in the range between 5 and 25, preferably between 10 and 20, and more preferably between 12 and 16. In one embodiment, the fin length L is about 25 µm and the fin width W is in the range between 0.15 µm and 0.7 µm.

FIG. 7A shows vertical growth profiles of thickness variations on a 600 nm regrowth substrate (wafer) in a 0.3 µm×1000 µm long fin array with 2 µm pitch according to an embodiment of the present disclosure. FIG. 7A includes a top portion showing the growth profiles on the wafer center and a bottom portion showing the growth profiles on the wafer edges. The left part of FIG. 7A shows the growth profiles of the left-side portion of the die on the substrate center (top portion) and the left-side portion of the die of the edge of the substrate (bottom portion). The center part of FIG. 7A shows the growth profiles of the center portion of the die on the substrate center (top portion) and the center portion of the die on the edge of the substrate (bottom portion). The right part of FIG. 7A shows the growth profiles of the right-side portion of the die on the substrate center (top portion) and the right-side portion of the die on the edge of the substrate (bottom portion). As can be seen in FIG. 7A, the regrown layers between the fins have a substantially uniform thickness across the die, i.e., the thickness variation is minor when scanning from the left side of the die to the center to the right side of the die.

FIG. 7B shows growth thickness variations on an 800 nm regrowth substrate (wafer) in a 0.3 µm×1000 µm long fin array with 2 µm pitch according to an embodiment of the present disclosure. The left part of FIG. 7B shows the growth profiles of the left-side portion of the die on the substrate center (top portion) and the left-side portion of the die of the edge of the substrate (bottom portion). The center part of FIG. 7B shows the growth profiles of the center portion of the die on the substrate center (top portion) and the center portion of the die on the edge of the substrate (bottom portion). The right part of FIG. 7B shows the growth profiles of the right-side portion of the die on the substrate center (top portion) and the right-side portion of the die on the edge of the substrate (bottom portion). Referring to FIG. 7B, the thicknesses of the die are uneven, i.e., the thicknesses vary depending on the scanning location of the die. For example, the thickness at the center region of the die appears to be greater than the thickness at the left and right edges of the die. This will be confirmed in FIGS. 11A through 11D.

Figure 8A:
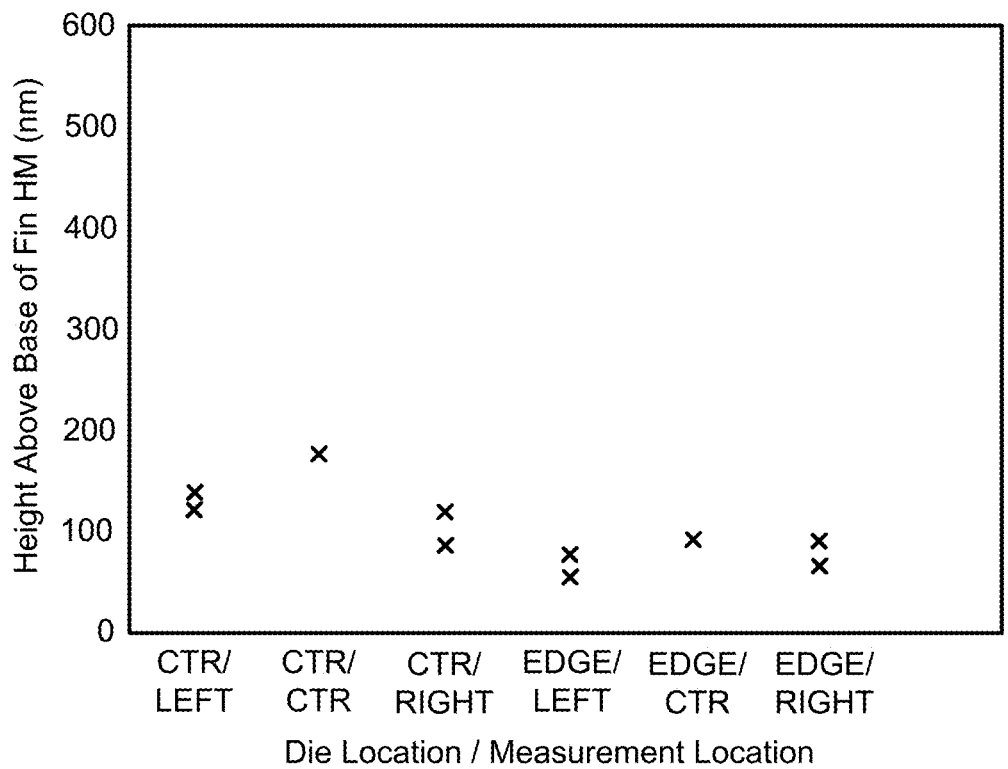
FIG. 8A shows growth thickness variations on a 600 nm regrowth wafer based on FIB data according to an embodiment of the present disclosure.

FIG. 8A shows growth thickness variations on a 600 nm regrowth substrate (wafer) in a 0.3 µm×1000 µm long fin array with 2 µm pitch based on FIB data according to an embodiment of the present disclosure. The x-axis represents the die location (i.e., the measurement location of the die on the substrate). CTR/LEFT denotes the measurement taken from the left-side portion of the die on the substrate center. CTR/CTR denotes the measurement taken from the center portion of the die on the substrate center. CTR/RIGHT denotes the measurement of the right-side portion of the die on the substrate center. EDGE/LEFT denotes the measurement taken from the left-side portion of the die on the edge of the substrate. EDGE/CTR denotes the measurement taken from the center portion of the die on the edge of the substrate. EDGE/RIGHT denotes the measurement taken from the right-side of the die on the edge of the substrate. The y-axis represents the height of the regrowth thickness of the semiconductor layer above the base (bottom surface) of the hard mask layer on the upper surface of the fin in nm. Referring to FIG. 8A, the thickness variation is in the range between 50 nm and 180 nm across the die locations. The thickness variations taken from different substrates with dies are the same location are small, e.g., less than 30 nm.

Figure 8B:
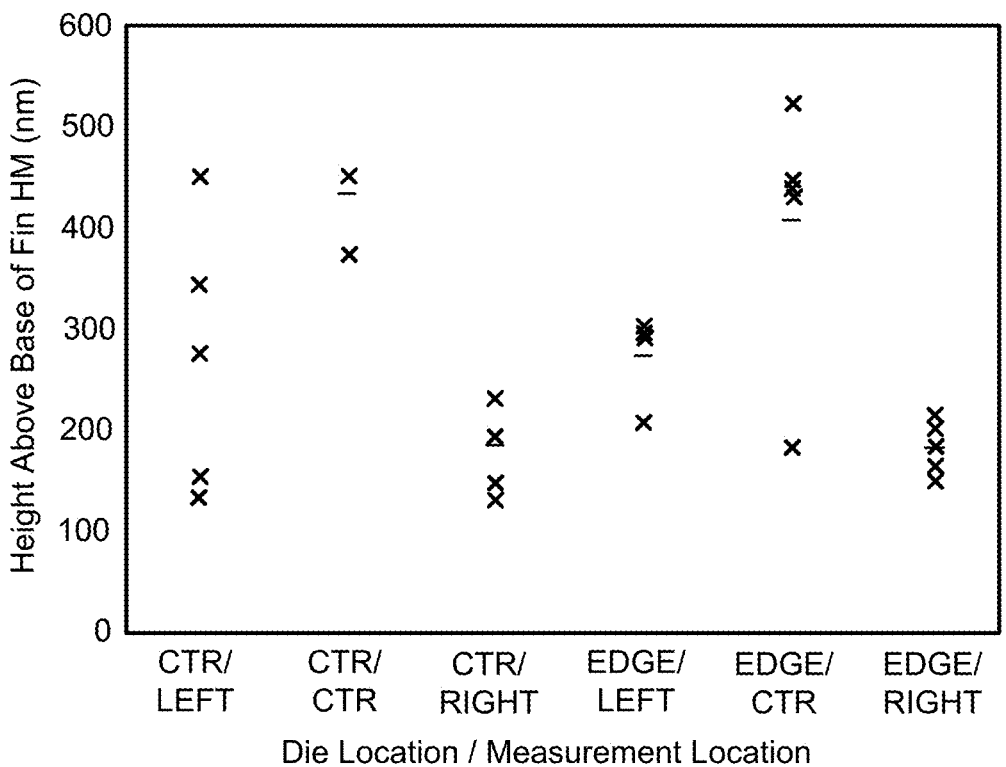
FIG. 8B shows growth thickness variations on an 800 nm regrowth wafer based on FIB data according to an embodiment of the present disclosure.

FIG. 8B shows growth thickness variations on an 800 nm regrowth substrate (wafer) in a 0.3 µm×1000 µm long fin array with 2 µm pitch based on FIB data according to an embodiment of the present disclosure. The x-axis represents the die location (i.e., the measurement location of the die on the substrate). CTR/LEFT denotes the measurement taken from the left-side portion of the die on the substrate center. CTR/CTR denotes the measurement taken from the center portion of the die on the substrate center. CTR/RIGHT denotes the measurement of the right-side portion of the die on the substrate center. EDGE/LEFT denotes the measurement taken from the left-side portion of the die on the edge of the substrate. EDGE/CTR denotes the measurement taken from the center portion of the die on the edge of the substrate. EDGE/RIGHT denotes the measurement taken from the right-side of the die on the edge of the substrate. The y-axis represents the height of the regrowth thickness of the semiconductor layer above the base (bottom surface) of the hard mask layer on the upper surface of the fin in nm. Referring to FIG. 8B, the thickness variation is in the range between 120 nm and 540 nm. The thickness variations taken from different substrates with dies are the same location are much larger. For example, the thickness variation of the dies taken from the left-side portion of the dies at the edge of the substrate may vary between 120 nm and 460 nm with an average thickness variation value of 280 nm. The 800 nm regrowth substrate leads to a large thickness variation than the 600 nm regrowth substrate. Thus, the inventors have developed and described herein a method of epitaxially regrowing the semiconductor layer in the recess region that separates the fins within a range between 450 nm and 650 nm to obtain a uniform thickness of the epitaxially regrown semiconductor layer. The method will be described in detail later below.

Figure 9A:
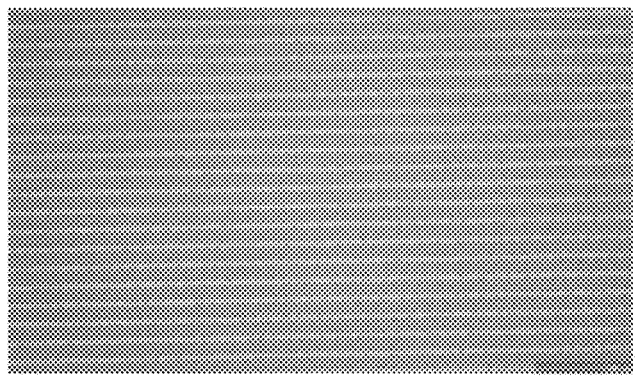
FIGS. 9A-9D are Nomarski-contrast micrograph images illustrating the effect of different fin lengths of an 800 nm regrowth wafer according to an embodiment of the present disclosure.
Figure 9B:
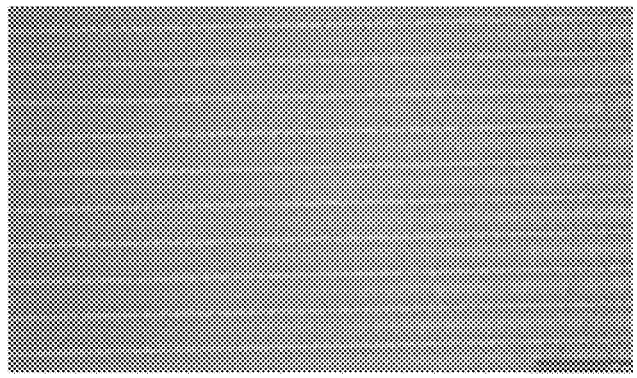
Figure 9C:
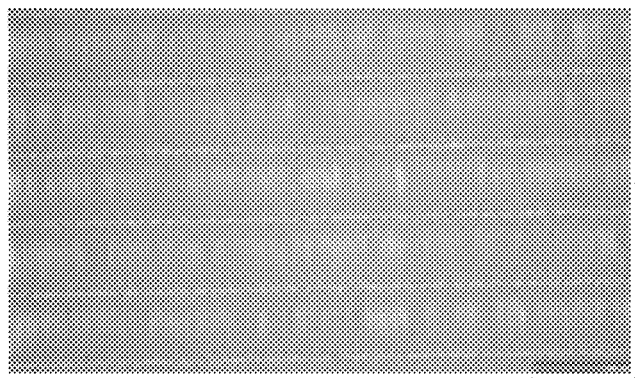
Figure 9D:
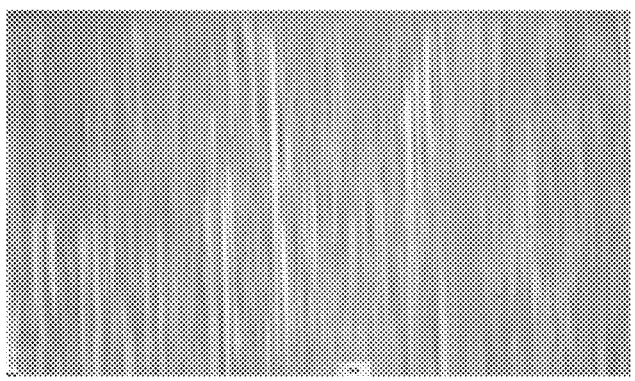

FIGS. 9A-9D are Nomarski-contrast micrograph images illustrating the effect of different fin lengths of an 800 nm regrowth wafer for 25 µm, 50 µm, 100 µm, and 1000 µm long fins, respectively, according to an embodiment of the present disclosure. Referring to FIGS. 9A-9D, the mottling increases with the fin length. FIG. 9A shows that the thickness variation is considered to be minor in the 25 µm length fin to significant in the 1000 µm length fin (in FIG. 9D).

Figure 10A:
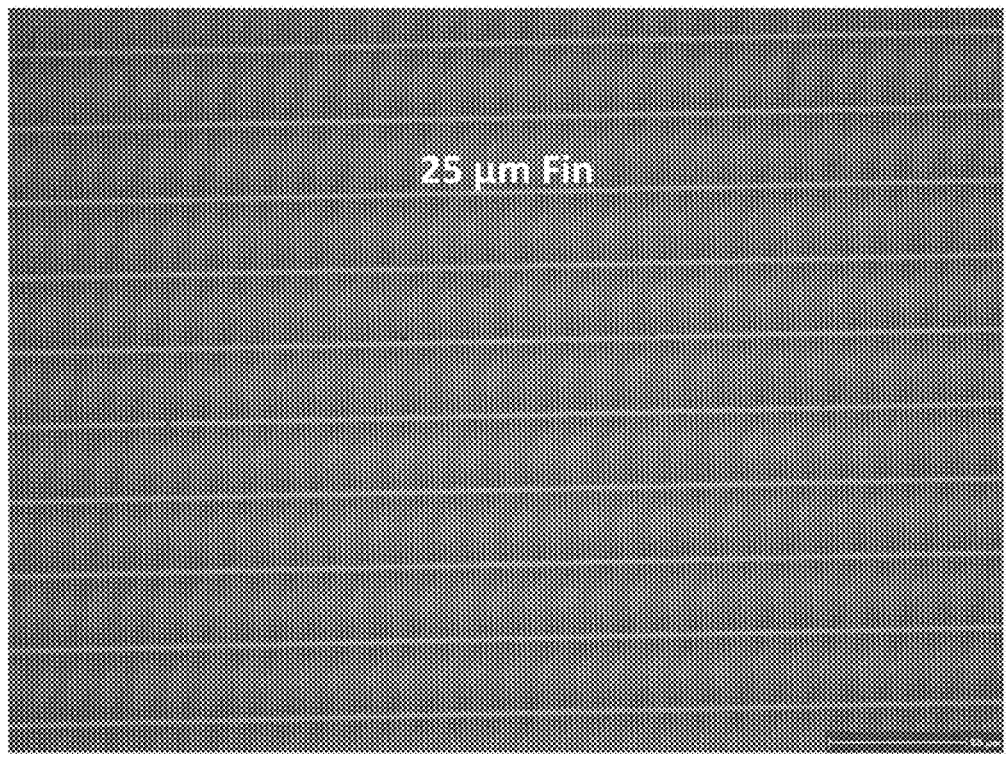
FIGS. 10A and 10B are high-resolution Nomarski-contrast micrograph images illustrating the effect of different fin lengths for a 25 µm fin and a 1000 µm fin on an 800 nm regrowth wafer according to an embodiment of the present disclosure.
Figure 10B:
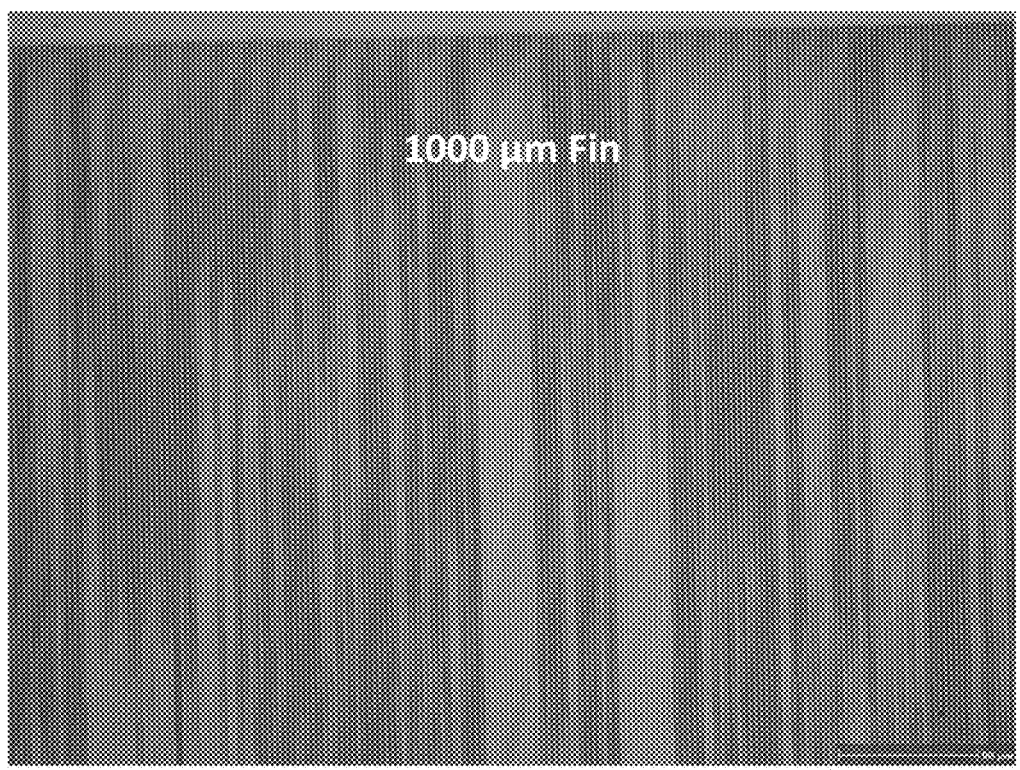

FIGS. 10A and 10B are high-resolution Nomarski-contrast micrograph images illustrating the effect of different fin lengths for a respective 25 µm fin and a 1000 µm fin of an 800 nm regrowth wafer according to an embodiment of the present disclosure. The patterned hard mask layer is shown as vertical black lines in the figures. The mottled appearance is much more pronounced for the 1000 µm fin.

FIGS. 11A-11D are Nomarski-contrast micrograph images (lower image) and profilometer traces (upper graph) illustrating the variation (sigma and range) of 25 µm, 50 µm, 100 µm, and 1000 µm fin lengths, respectively, on an 800 nm regrowth substrate (wafer) according to an embodiment of the present disclosure. The fin length is defined as an elongated bar extending along the array length direction (the y-direction) shown in FIGS. 5 and 6. The horizontal axis represents the scan distance from 0 µm to 1200 µm of the die. The vertical axis represents the height (thickness of the epitaxially regrown semiconductor layer). FIG. 11A includes a top portion showing that the range of the 25 µm length fin is 1129 Å and the sample standard deviation σ is 125 Å and a bottom portion showing the Nomarski-contrast micrograph image of the 25 µm length fin. FIG. 11B includes a top portion showing that the range of the 50 µm length fin is 1447 Å and the sample standard deviation σ is 175 Å and a bottom portion showing the Nomarski-contrast micrograph image of the 50 µm length fin. FIG. 11C includes a top portion showing that the range of the 100 µm length fin is 2099 Å and the sample standard deviation σ is 359 Å and a bottom portion showing the Nomarski-contrast micrograph image of the 100 µm length fin. FIG. 11D includes a top portion showing that the range of the 1000 µm length fin is 6426 Å and the sample standard deviation σ is 1144 Å and a bottom portion showing the Nomarski-contrast micrograph image of the 1000 µm length fin. As can be seen clearly in FIGS. 11A through 11D, the variation (the range of the thickness variation and sample standard deviation σ) increases with the fin length (from 25 µm to 1000 µm). The thickness at the edge of the die (fin array) appears to be smaller than the thickness in the center region of the fin array.

Figure 12:
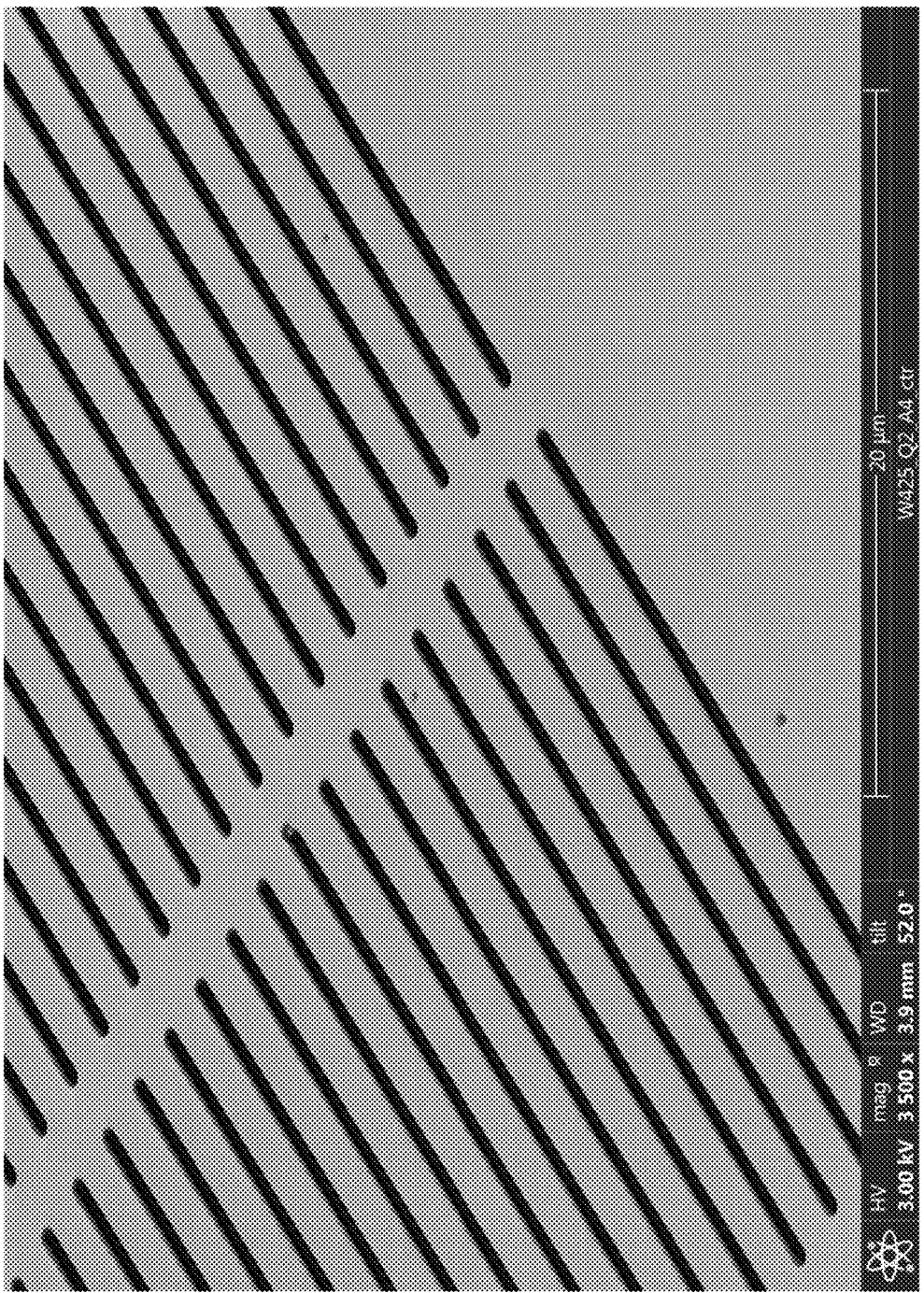
FIG. 12 is an oblique view SEM image of a 0.3 µm×25 µm (width×length) fin array with a 2 µm pitch on a 500 nm regrowth wafer according to an embodiment of the present disclosure.

FIG. 12 is an oblique view SEM image of a 0.3 µm (width)×25 µm (length) fin array with a 2 µm pitch on a 500 nm regrowth wafer according to an embodiment of the present disclosure. Referring to FIG. 12, the surface of the epitaxial regrown semiconductor layer of the 25 µm high fin array is smooth. That is, the thickness variation of the epitaxially regrown semiconductor layer is small.

The present inventors have determined that the fin array with short fins (i.e., less than 100 µm in length) has good uniform regrowth of the semiconductor material, i.e., the surface of the epitaxially regrown gate layer is uniform across the recess region (from trench to trench between the fins) as shown in FIG. 1. As an example, according to an embodiment, a layout structure of the fin array shown in FIG. 6 is utilized, where the long fins each are divided (segmented) into a plurality of short fins. In one embodiment, referring to FIG. 1 and FIG. 6, the physical layout structure of the fin array includes at least a first row of fins (e.g., row 2 in FIG. 6) and a second row of fins (row 3 in FIG. 6), the fins are arranged in parallel to each other along the direction of the array width (i.e., along the direction of the rows). The fins arranged in the first row of the fin array are spaced from each other by a first pitch, and the fins arranged in the second row of the fin array are spaced from each other by a second pitch. In one embodiment, the first pitch and the second pitch have the same width. In one embodiment, the first row of fins and the second row of fins are spaced apart from each other by a space that is about the same as the first pitch or the second pitch. In an embodiment, the fins are less than 1.0 µm in width, and the space between the fins is less than 2.5 µm. In one embodiment, the fins are 0.3 µm or less in width, and the space between the fins is less than 2.0 µm. In an embodiment, the length of the fins is less than 50 µm. In an embodiment, the length of the fins is 25 µm or less.

Figure 13:
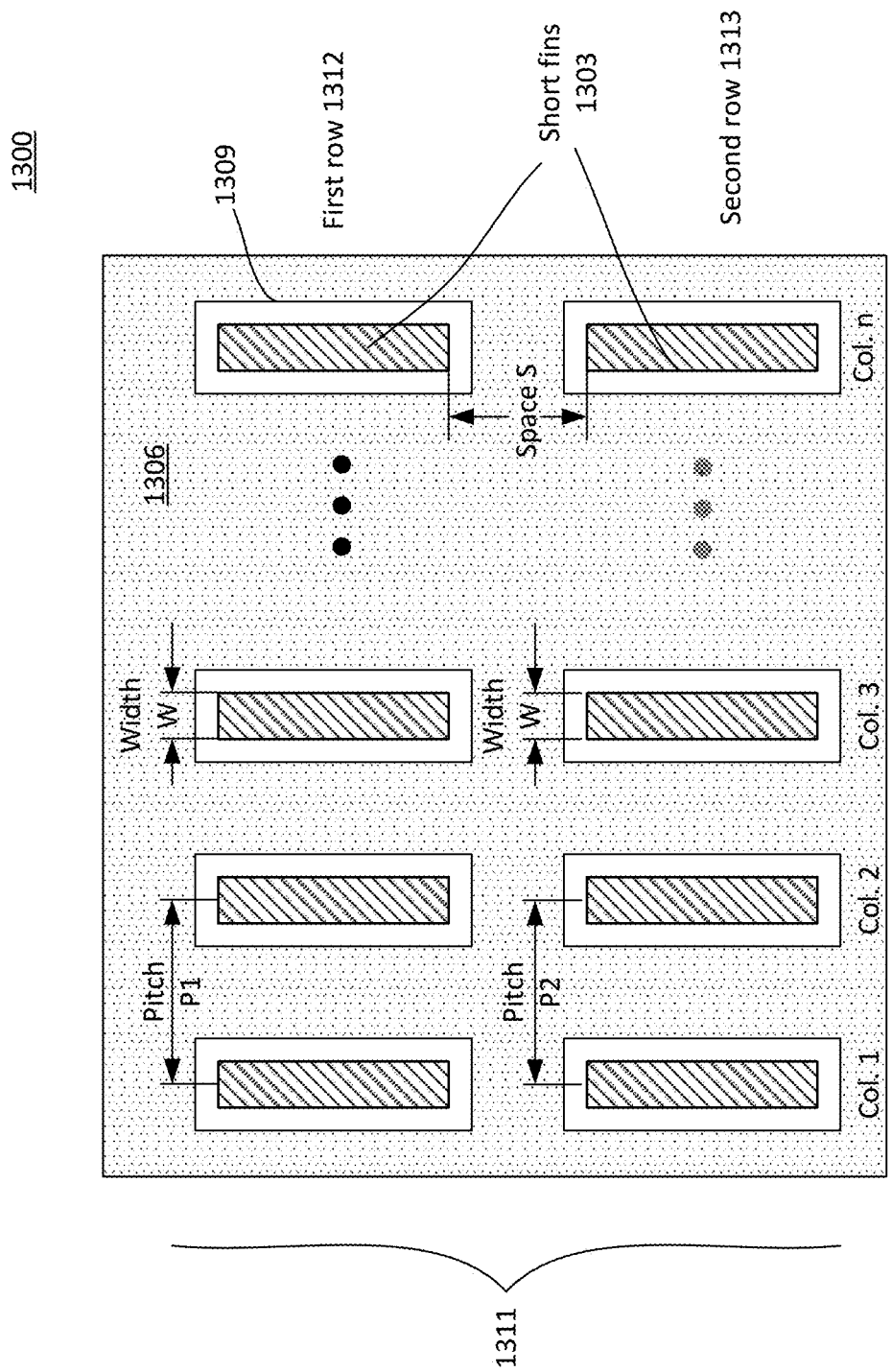
FIG. 13 is a plan view of a fin pattern layout illustrating semiconductor fins having short lengths according to an embodiment of the present disclosure.

FIG. 13 is a plan view of a fin pattern layout illustrating an integrated circuit (semiconductor device) 1300 including a fin array having a plurality of short semiconductor fins 1303 according to an embodiment of the present disclosure. Referring to FIG. 13, integrated circuit (semiconductor device) 1300 includes a fin array 1311 having a first row 1312 of fins and a second row 1313 of fins. The fins of the first row 1312 are arranged in parallel to each other and spaced apart from each other by a first pitch P1. The fins of the second row are arranged in parallel to each other and spaced apart from each other by a second pitch P2. The first row and the second row are spaced apart from each other by a space S. In one embodiment, the space S is substantially equal to the first pitch P1 or to the second pitch P2. In one embodiment, the first pitch P1 and the second pitch P2 have the same dimension (i.e., the distance between adjacent columns of fins is the same). In one embodiment, the fin array width is determined by the number of columns (col. 1 to col. n) that are substantially perpendicular to the first and second rows. In one embodiment, each of the fins has a width that is in the range between 0.15 µm and 0.3 µm, preferably 0.2 µm and a length in the range between 10 µm and 100 µm, preferably 50 µm, and more preferably 25 µm. In one embodiment, integrated circuit (semiconductor device) 1300 may further include an epitaxially regrown semiconductor layer (regrown gate regions 104 of FIG. 1) surrounding the fins and having a uniform surface that is substantially flush or planar with the upper surface of the fins. In one embodiment, Integrated circuit 1300 may also include a gate metal layer 1306 (shown as a dotted surface pattern overlying the epitaxially regrown semiconductor layer (not shown) and surrounding the fins (separated from the fins by openings 1309) to form a mesh-like grid structure to reduce the resistance of the gate metal contact. The mesh-like grid structure of the metal gate layer is utilized in some embodiments of the present invention to reduce the gate metal contact resistance for high-frequency applications. In one embodiment, the fins are disposed on a drift layer (drift layer 102 of FIG. 1), which, in turn, is disposed on a substrate (semiconductor substrate 101 of FIG. 1). In one embodiment, the substrate is an n+ doped GaN substrate, the drift layer is an n− doped GaN layer, the fins includes an n doped GaN layer, and the epitaxially regrown semiconductor layer is a p doped GaN gate layer. In one embodiment, the gate metal layer includes TiN. In one embodiment, a source metal contact (source metal layer 105 of FIG. 1) is disposed on the upper surface of the fins. The openings 1309 of the gate metal layer 1306 form a plurality of moats surrounding the source metal contact of the fins. In one embodiment, integrated circuit 1300 is a transistor device consisting of a common control gate surrounding a plurality of conducting channels. A cross-sectional view of a portion of integrated circuit 1300 is shown in FIG. 1.

Figure 14:
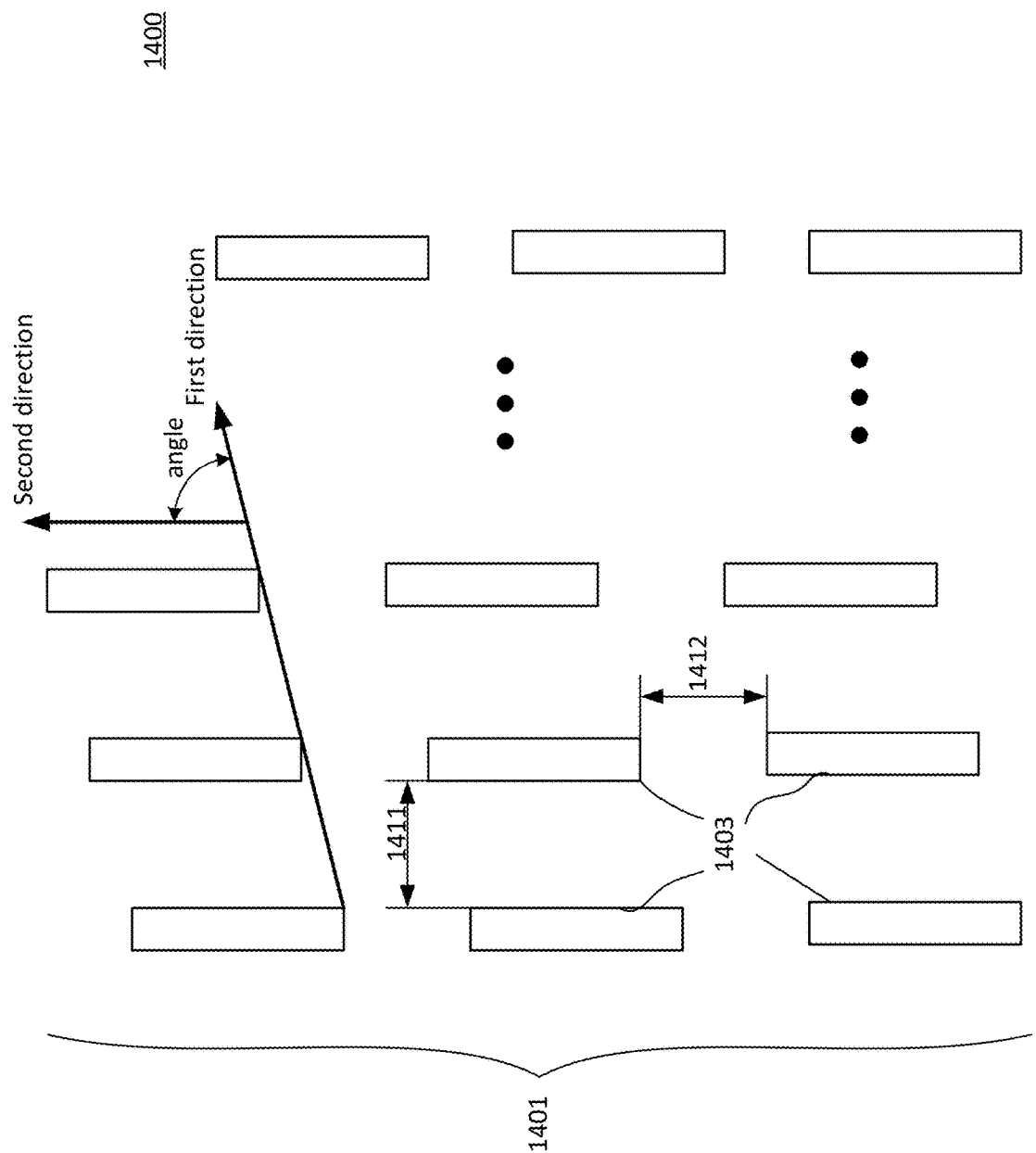
FIG. 14 is a plan view of a fin pattern layout illustrating semiconductor fins having short lengths according to another embodiment of the present disclosure.

FIG. 14 is a plan view of an alternative physical layout illustrating an integrated circuit (semiconductor device) 1400 having a fin array including a plurality of short semiconductor fins according to another embodiment of the present disclosure. Referring to FIG. 14, integrated circuit 1400 includes a fin array 1401 having a plurality of semiconductor fins 1403 that are separated in a first direction by a first distance 1411 and are separated in a second direction by a second distance 1412, the first direction is tilted toward the second direction by an angle. In one embodiment, the first distance 1411 is equal to the second distance 1412. In one embodiment, the first distance 1411 is not equal to the second distance 1412. In one embodiment, the angle between the first direction and the second direction is less than 90 degrees, preferably in the range between 10 degrees and 80 degrees, and more preferably between 30 degrees and 60 degrees. In one embodiment, the semiconductor fins are aligned in a direction parallel to the first direction and to the second direction, and the first and second direction are angularly offset by an angle of 45 degrees.

Figure 15:
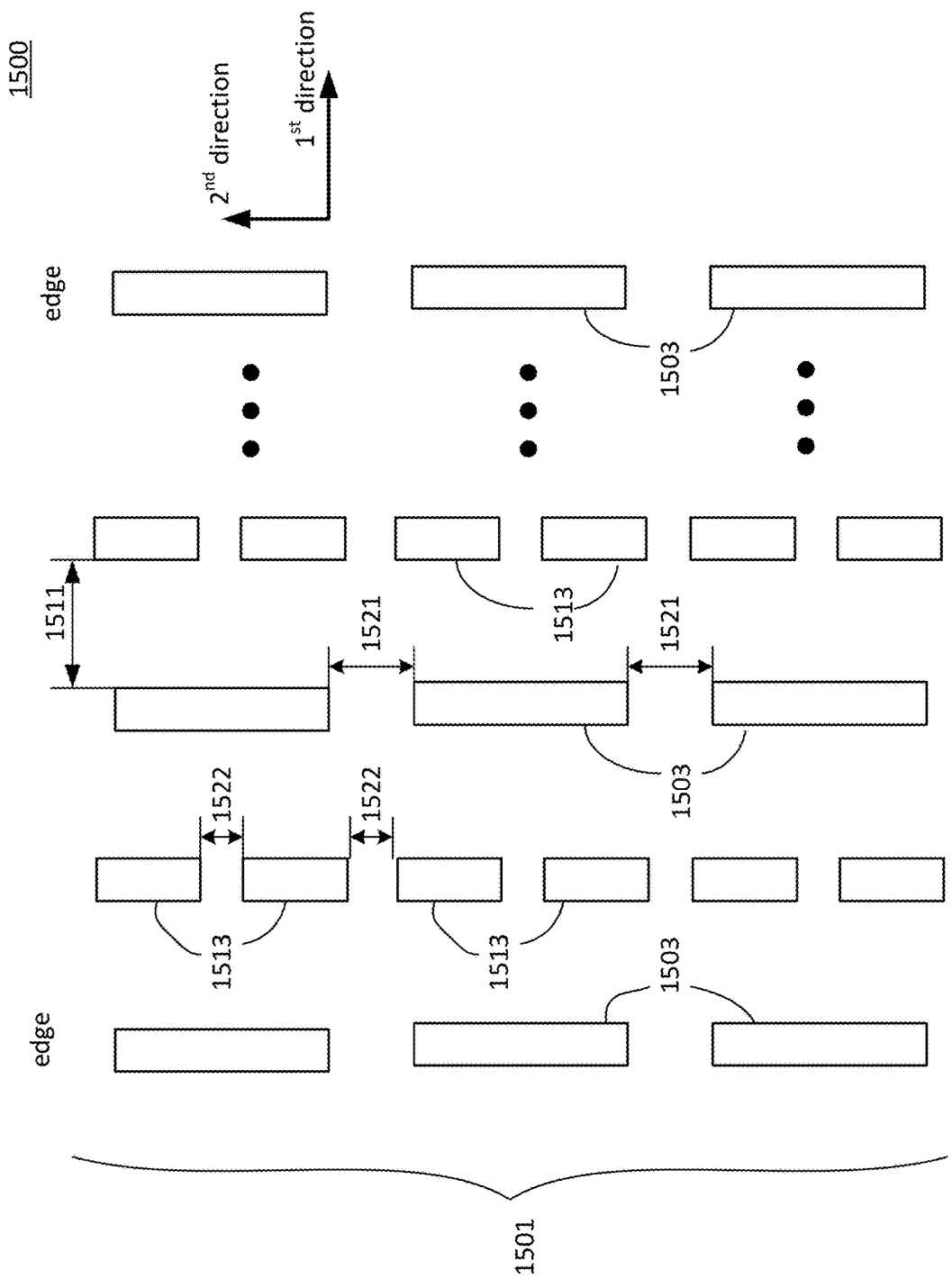
FIG. 15 is a plan view of a fin pattern layout illustrating semiconductor fins having short lengths according to yet another embodiment of the present disclosure.

FIG. 15 is a plan view of a fin pattern layout illustrating an integrated circuit 1500 having a fin array including a plurality of short semiconductor fins according to yet another embodiment of the present disclosure. Referring to FIG. 15, integrated circuit 1500 includes a fin array 1501 having a plurality of semiconductor fins 1503/1513 that are separated in a first direction by a first distance 1511 and are separated in a second direction by a second distance 1521 and by a third distance 1522. The first direction can be orthogonal to the second direction. In one embodiment, the second distance 1521 is equal to the first distance 1511, and the third distance 1522 is equal to half the first distance 1511. In one embodiment, the fins at the edge of the fin array have a length twice the length of the fins at the center portion of the fin array (not shown). In one embodiment, the fins in the fin array are alternately arranged both in the first direction and in the second direction. In an example embodiment, the fin array includes first fins 1503 at the opposite edges of the fin array, and second fins 1513 alternately arranged between first fins 1503. First fins 1503 have a length twice second fins 1513 that are disposed therebetween.

Figure 16:
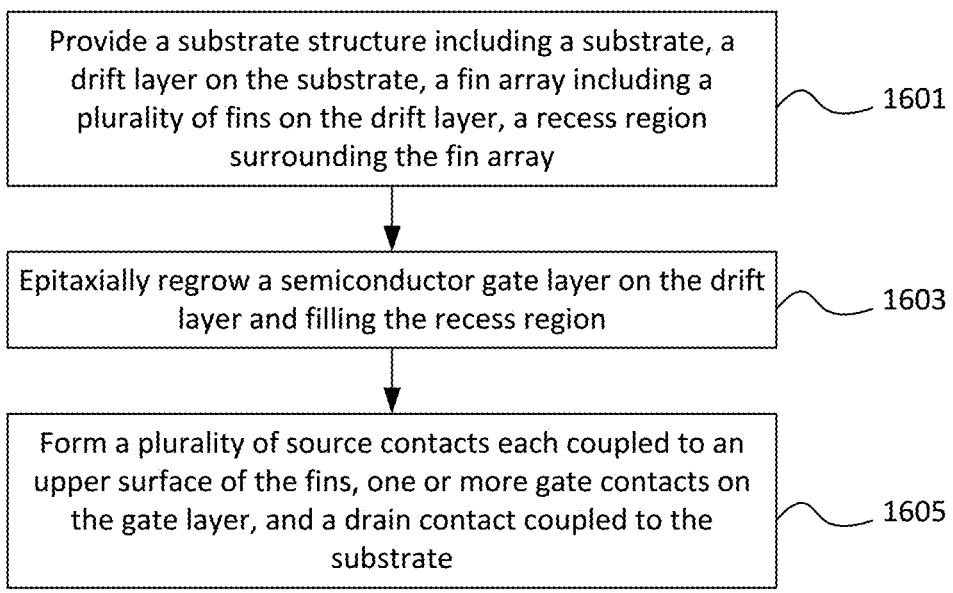
FIG. 16 is a simplified flowchart illustrating a method of fabricating a semiconductor device having a fin array according to an embodiment of the present disclosure.

FIG. 16 is a simplified flowchart illustrating a method 1600 of fabricating a semiconductor device having a fin array according to an embodiment of the present disclosure. Method 1600 includes providing a semiconductor structure having a semiconductor substrate of a first conductivity type, a drift layer on the semiconductor substrate, and a fin array having a plurality of semiconductor fins on the drift layer (1601). The fins are surrounded by a recess region. The fin array includes at least a first row of fins and a second row of fins that are separated in a first direction by a first distance and are separated in a second direction by a second distance. Method 1800 further includes epitaxially regrowing a gate layer of a second conductivity type in the recess region (1603). The second conductivity type is opposite the first conductivity type. The epitaxially regrown gate layer may have an upper surface that is substantially planar or flush with the upper surface of the fins. Method 1600 also includes forming a plurality of source contacts on the upper surface of the fins, one or more gate contacts on the epitaxially regrown gate layer, and a drain contact on the bottom surface of the semiconductor substrate (1605).

In one embodiment, providing the semiconductor structure may include providing the semiconductor substrate, epitaxially growing the drift layer on the semiconductor substrate, epitaxially growing a semiconductor layer having the first conductivity type on the drift layer, forming a metal layer on the semiconductor layer, forming a patterned hard mask layer on the metal layer, and etching the metal layer and the semiconductor layer using the patterned hard mask layer as a mask to form the fin array and the recess region surrounding the fin array. In one embodiment, the semiconductor substrate is a III-nitride compound substrate. In one embodiment, the metal layer is omitted.

In one embodiment, the patterned hard mask layer includes an array of elongated shapes arranged in parallel to each other and configured to form a plurality of semiconductor fins. In one embodiment, the elongated shapes each have a width in a range between about 0.2 μm and about 0.7 μm, a length in a range between about 25 μm and about 500 μm, and a pitch between two adjacent elongated shapes is in a range between about 1.9 μm and about 10 μm. The scope of the present invention is not limited to the arrangement of the fins in the drawings. In one embodiment, the elongated shapes are arranged in a first row and in a second row that are separated in a first direction by a first distance and are separated in a second direction by a second distance. In one embodiment, the first direction is orthogonal to the second direction. In one embodiment, the first direction is offset in relation to the second direction by an angle in the range between 30 degrees and 50 degrees, preferably between 35 degrees and of 45 degrees. In one embodiment, the elongated shapes have a same size, and the first distance is equal to the second distance, as shown in FIG. 14. In one embodiment, the elongated shapes have non-uniform sizes, and the first distance is not equal to the second distance, as shown in FIG. 15. The present inventors have observed that, by using a fin array having short fins that are arranged according to physical layouts shown in FIGS. 13 through 15, a uniform thickness of the epitaxially regrown gate layer can be obtained, as shown in FIG. 11A.

In one embodiment, the substrate is a III-V compound substrate including an n-GaN epitaxial layer, and the gate layer include a p-GaN regrown epitaxial layer. In one embodiment, the p-GaN regrowth is performed at a growth temperature between 850° C. and 1050° C., preferably 950° C., and at a growth pressure between 200 mbar and atmospheric pressure, preferably between 600 mbar and atmospheric pressure.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A semiconductor device comprising:
a semiconductor substrate having a first conductivity type;
a drift layer of the first conductivity type coupled to the semiconductor substrate;
a fin array comprising a plurality of rows of fins on the drift layer, the plurality of rows of fins including a first row of fins and a second row of fins, the first row of fins comprising a plurality of first elongated fins arranged in parallel to each other along a first row direction and separated by a first distance, and the second row of fins comprising a plurality of second elongated fins arranged in parallel to each other along a second row direction and separated by a second distance equal to the first distance;
a gate layer of a second conductivity type opposite the first conductivity type on the drift layer and surrounding each of the plurality of first elongated fins and each of the plurality of second elongated fins; and
a space equal to the first distance between the first row of fins and the second row of fins.

2. The semiconductor device of claim 1, further comprising a metal gate layer on the gate layer.

3. The semiconductor device of claim 2, wherein the gate layer has an upper surface substantially flush with an upper surface of the fin array.

4. The semiconductor device of claim 2, further comprising:
a plurality of source contacts, each coupled to an upper surface of each fin of the fin array;
one or more gate contacts formed from the metal gate layer and coupled to the gate layer; and
a drain contact coupled to the semiconductor substrate.

5. The semiconductor device of claim 1, wherein the plurality of first elongated fins and the plurality of second elongated fins have equal length.

6. The semiconductor device of claim 1, wherein the plurality of first elongated fins and the plurality of second elongated fins are offset from each other by an amount equal to the space.

7. The semiconductor device of claim 1, wherein the plurality of first elongated fins and the plurality of second elongated fins are arranged in a plurality of columns, a first portion of the first elongated fins and a first portion of the second elongated fins in a first column having a length different than a length of a second portion of the first elongated fins and a second portion of the second elongated fins in a second column adjacent to the first column.

8. The semiconductor device of claim 1, wherein a first portion of the plurality of first elongated fins and a first portion of the plurality of second elongated fins disposed in a center region of the semiconductor device has a length greater than a second portion of the plurality of first elongated fins and a second portion of the plurality of second elongated fins disposed in an edge region.

9. The semiconductor device of claim 1, wherein a first portion of the plurality of first elongated fins and a first portion of the plurality of second elongated fins disposed in a center region of the semiconductor device has a length smaller than a second portion of the plurality of first elongated fins and a second portion of the plurality of second elongated fins disposed in an edge region.

10. The semiconductor device of claim 1, wherein:
a ratio between a fin width and a pitch between two adjacent fins is in the range between about 0.08 and 0.13; and
a ratio between a fin length and the pitch between two adjacent fins is in the range between 5 and 25.

11. The semiconductor device of claim 1, wherein a ratio between a fin length and a fin width is >50:1.

12. The semiconductor device of claim 1, wherein each fin in the first row of fins and the second row of fins has a length in a range between 10 µm and 60 µm, and a width in a range between 0.15 µm and 0.7 µm.

13. A semiconductor device comprising:
a semiconductor substrate having a first conductivity type;
a drift layer of the first conductivity type coupled to the semiconductor substrate;
a fin array comprising a plurality of rows of fins on the drift layer, the plurality of rows of fins including a first row of fins and a second row of fins, the first row of fins comprising a plurality of first elongated fins arranged in parallel to each other along a first row direction and separated by a first distance, and the second row of fins comprising a plurality of second elongated fins arranged in parallel to each other along a second row direction and separated by a second distance, wherein each of the first distance and the second distance is non-uniform varying from a small distance in an edge region of the semiconductor substrate to a large distance in a center region of the semiconductor substrate;
a gate layer of a second conductivity type opposite the first conductivity type on the drift layer and surrounding each of the plurality of first elongated fins and each of the plurality of second elongated fins; and
a space between the first row of fins and the second row of fins.

14. The semiconductor device of claim 13, further comprising a metal gate layer on the gate layer.

15. The semiconductor device of claim 14, wherein the gate layer has an upper surface substantially flush with an upper surface of the fin array.

16. The semiconductor device of claim 14, further comprising:
a plurality of source contacts, each coupled to an upper surface of each fin of the fin array;
one or more gate contacts formed from the metal gate layer and coupled to the gate layer; and
a drain contact coupled to the semiconductor substrate.

17. The semiconductor device of claim 13, wherein the plurality of first elongated fins and the plurality of second elongated fins have equal length.

18. The semiconductor device of claim 13, wherein the plurality of first elongated fins and the plurality of second elongated fins are offset from each other by an amount equal to the space.

19. The semiconductor device of claim 13, wherein the plurality of first elongated fins and the plurality of second elongated fins are arranged in a plurality of columns, a first portion of the first elongated fins and a first portion of the second elongated fins in a first column having a length different than a length of a second portion of the first elongated fins and a second portion of the second elongated fins in a second column adjacent to the first column.

20. The semiconductor device of claim 13, wherein a first portion of the plurality of first elongated fins and a first portion of the plurality of second elongated fins disposed in a center region of the semiconductor device has a length greater than a second portion of the plurality of first elongated fins and a second portion of the plurality of second elongated fins disposed in an edge region.

* * * * *